United States Patent
Yuan et al.

(10) Patent No.: US 11,955,089 B2
(45) Date of Patent: Apr. 9, 2024

(54) DISPLAY SUBSTRATE AND DISPLAY DEVICE

(71) Applicants: HEFEI BOE JOINT TECHNOLOGY CO., LTD., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN); Pan Xu, Beijing (CN)

(73) Assignees: HEFEI BOE JOINT TECHNOLOGY CO., LTD, Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/680,956

(22) Filed: Feb. 25, 2022

(65) Prior Publication Data

US 2022/0180816 A1    Jun. 9, 2022

Related U.S. Application Data

(63) Continuation-in-part of application No. PCT/CN2021/099017, filed on Jun. 8, 2021.

(30) Foreign Application Priority Data

Jul. 21, 2020  (CN) .......................... 202010707527.3

(51) Int. Cl.
G09G 3/3275    (2016.01)
H10K 59/131    (2023.01)

(52) U.S. Cl.
CPC .......... *G09G 3/3275* (2013.01); *H10K 59/131* (2023.02); *G09G 2310/061* (2013.01)

(58) Field of Classification Search
CPC ... G09G 3/3233; G09G 3/3275; H10K 59/131
See application file for complete search history.

(56) References Cited

U.S. PATENT DOCUMENTS

| 10,891,896 B2 | 1/2021 | Wu |
| 2013/0314308 A1 | 11/2013 | Hsu et al. |
| 2015/0009105 A1 | 1/2015 | Nomura |
| 2015/0187272 A1 | 7/2015 | Kimura et al. |

(Continued)

FOREIGN PATENT DOCUMENTS

| CN | 102779834 A | 11/2012 |
| CN | 104575436 A | 4/2015 |

(Continued)

OTHER PUBLICATIONS

Extended European search report of counterpart European application No. 21846073.1 dated Dec. 1, 2022.

(Continued)

*Primary Examiner* — Sardis F Azongha
(74) *Attorney, Agent, or Firm* — Lippes Mathias LLP

(57) ABSTRACT

Provided is a display substrate. The display substrate includes two pixels arranged along a first direction and adjacent to each other on a base substrate, and a pixel circuit in each of the two pixels includes a drive transistor, a first reset transistor, and a second reset transistor. A display device is also provided.

11 Claims, 11 Drawing Sheets

(56) References Cited

U.S. PATENT DOCUMENTS

| | | |
|---|---|---|
| 2016/0372070 A1 | 12/2016 | Hu et al. |
| 2017/0018243 A1 | 1/2017 | Huang et al. |
| 2017/0221419 A1 | 8/2017 | Xiang et al. |
| 2017/0221423 A1 | 8/2017 | Xiang et al. |
| 2018/0137818 A1* | 5/2018 | Kim .................... G09G 3/3233 |
| 2019/0228695 A1 | 7/2019 | Zou |
| 2021/0028195 A1* | 1/2021 | Xu ..................... H01L 27/1244 |
| 2021/0202612 A1* | 7/2021 | Jung ...................... H10K 59/88 |
| 2022/0180816 A1 | 6/2022 | Yuan et al. |

FOREIGN PATENT DOCUMENTS

| | | |
|---|---|---|
| CN | 104700803 A | 6/2015 |
| CN | 106531084 A | 3/2017 |
| CN | 106710525 A | 5/2017 |
| CN | 106952607 A | 7/2017 |
| CN | 108682366 A | 10/2018 |
| CN | 110189706 A | 8/2019 |
| CN | 111179828 A | 5/2020 |
| CN | 111429828 A | 7/2020 |
| CN | 111816123 A | 10/2020 |

OTHER PUBLICATIONS

International search report of PCT application No. PCT/CN2021/099017 dated Aug. 30, 2021.

China National Intellectual Property Administration, First office action of Chinese application No. 202010707527.3 dated Apr. 2, 2021, which is foreign counterpart application of this US application.

China National Intellectual Property Administration, Second office actionof Chinese application No. 202010707527.3 dated Sep. 8, 2021, which is foreign counterpart application of this US application.

* cited by examiner

DISPLAY SUBSTRATE AND DISPLAY DEVICE

CROSS-REFERENCE TO RELATED APPLICATION

This application is a continuation-in-part of international application No. PCT/CN2021/099017, filed on Jun. 8, 2021, which claims priority to Chinese Patent Application No. 202010707527.3, filed on Jul. 21, 2020 and entitled "DISPLAY SUBSTRATE AND DISPLAY DEVICE," the disclosures of which are herein incorporated by reference in their entirety.

TECHNICAL FIELD

The present disclosure relates to the field of display technologies, and in particular, relates to a display substrate and a display device.

BACKGROUND

Organic light emitting diode (OLED) display substrates are widely used in the display field due to advantages such as self-luminescence, wide viewing angle, and fast response speed.

In the related art, an OLED display substrate includes a base substrate, and a plurality of pixels disposed on the base substrate. Each pixel includes a pixel circuit and a light emitting element. The pixel circuit is coupled to a plurality of signal lines and a light emitting element, the pixel circuit is configured to transmit a light emitting drive signal to the light emitting element based on signals provided by the plurality of signal lines, to drive the light emitting element to emit light. The plurality of signal lines includes a gate line, a data line, a reset signal line, a reset control line, and a light emitting control line.

SUMMARY

Embodiments of the present disclosure provide a display substrate and a display device, which can solve the problem of chaotic and complex layout of signal lines on the display substrate. The technical solutions are as follows.

In an aspect, a display substrate is provided. The display substrate includes:
  a base substrate;
  a first pixel and a second pixel disposed on the base substrate, wherein the first pixel and the second pixel are arranged along a first direction and are adjacent, and both the first pixel and the second pixel include a pixel circuit and a light emitting element, the pixel circuit including a drive transistor, a first reset transistor, and a second reset transistor; wherein
  the first reset transistor is coupled to a first reset control line, a first reset signal line, and a gate of the drive transistor, and the first reset transistor is configured to, in response to a first reset control signal provided by the first reset control line, transmit a first reset signal provided by the first reset signal line to the gate of the drive transistor to reset the gate of the drive transistor; and
  the second reset transistor is coupled to a second reset control line, a second reset signal line, and a first electrode of the light emitting element, and the second reset transistor is configured to, in response to a second reset control signal provided by the second reset control line, transmit a second reset signal provided by the second reset signal line to the first electrode of the light emitting element to reset the first electrode of the light emitting element;
  wherein the first reset signal line includes a first portion extending along a second direction, and the first reset transistor in the first pixel and the first reset transistor in the second pixel are arranged symmetrically along a symmetry axis of the first portion, the second direction being a row direction, and the second direction being intersected with the first direction.

Optionally, the second reset transistor in the first pixel and the second reset transistor in the second pixel are arranged symmetrically along the symmetry axis of the first portion.

Optionally, the drive transistor in the first pixel and the drive transistor in the second pixel are arranged symmetrically along the symmetry axis of the first portion.

Optionally, the second reset signal line includes a second portion extending along the second direction; the first reset transistor in the first pixel and the first reset transistor in the second pixel are arranged symmetrically along a symmetry axis of the second portion.

Optionally, the second reset transistor in the first pixel and the second reset transistor in the second pixel are arranged symmetrically along the symmetry axis of the second portion.

Optionally, the drive transistor in the first pixel and the drive transistor in the second pixel are arranged symmetrically along the symmetry axis of the second portion.

Optionally, the first reset control line extends along the second direction;
  the first reset control line coupled to the pixel circuit in the first pixel and the first reset control line coupled to the pixel circuit in the second pixel are arranged symmetrically along the symmetry axis of the first portion and arranged symmetrically along the symmetry axis of the second portion.

Optionally, the second reset control line extends along the second direction; and
  the second reset control line coupled to the pixel circuit in the first pixel and the second reset control line coupled to the pixel circuit in the second pixel are arranged symmetrically along the symmetry axis of the first portion and arranged symmetrically along the symmetry axis of the second portion.

Optionally, the symmetry axis of the first portion is overlapped with the symmetry axis the second portion.

Optionally, the pixel circuit further includes: a light emitting control transistor;
  wherein the light emitting control transistor is coupled to a light emitting control line, a first power terminal, and a first electrode of the drive transistor, and the light emitting control transistor is configured to, in response to a light emitting control signal provided by the light emitting control line, transmit a first power signal provided by the first power terminal to the first electrode of the drive transistor; and
  a second electrode of the drive transistor is coupled to the first electrode of the light emitting element, a second electrode of the light emitting element is coupled to a second power terminal, the drive transistor is configured to transmit a light emitting drive signal to the first electrode of the light emitting element based on a potential of the gate of the drive transistor and a potential of the first electrode of the drive transistor, and the light emitting element is configured to emit light based on the light emitting drive signal and a second power signal provided by the second power terminal.

Optionally, the light emitting control transistor in the pixel circuit in the first pixel and the light emitting control transistor in the pixel circuit in the second pixel are the same transistor; and the light emitting control transistor is disposed between the second reset signal line coupled to the pixel circuit in the first pixel and the second reset signal line coupled to the pixel circuit in the second pixel.

Optionally, the light emitting control line extends along the second direction, and both the symmetry axis of the first portion and the symmetry axis of the second portion are overlapped with the light emitting control line.

Optionally, the pixel circuit further includes: a data write transistor, wherein the data write transistor is coupled to a gate line, a data line, and the drive transistor, and the data write transistor is configured to transmit a data signal provided by the data line to the drive transistor in response to a gate drive signal provided by the gate line.

Optionally, the data write transistor in the first pixel and the data write transistor in the second pixel are arranged symmetrically along the symmetry axis of the first portion.

Optionally, the data write transistor in the first pixel and the data write transistor in the second pixel are arranged symmetrically along the symmetry axis of the second portion.

Optionally, the gate line extends along the second direction; the gate line coupled to the pixel circuit in the first pixel and the gate line coupled to the pixel circuit in the second pixel are arranged symmetrically along the symmetry axis of the first portion and the symmetry axis of the second portion.

Optionally, wherein the data line extends along the first direction.

Optionally, the first reset signal line, the first reset control line, the gate line, the second reset control line, the second reset signal line, and the light emitting control line coupled to the pixel circuit in one of the first pixel and the second pixel are arranged sequentially along a direction going close to the other one of the first pixel and the second pixel.

Optionally, in the pixel circuit in one of the first pixel and the second pixel, the first reset transistor, the data write transistor, the drive transistor, the second reset transistor, and the light emitting control transistor are sequentially arranged along the direction going close to the other one of the first pixel and the second pixel; and the first reset transistor, the data write transistor, the drive transistor, and the second reset transistor are disposed between the first reset signal line and the second reset signal line.

In another aspect, a display device is provided. The display device includes: a power supply component, and the display substrate described in the above aspect, wherein the power supply component is coupled to the display substrate, and is configured to supply power to the display substrate.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and persons of ordinary skill in the art can still derive other drawings from these accompanying drawings without creative efforts.

DETAILED DESCRIPTION

For clearer descriptions of the objectives, technical solutions, and advantages of inventive concepts of the embodiments of the present disclosure, the inventive concepts of the embodiments of the present disclosure are described in detail hereinafter with reference to the accompanying drawings and some embodiments.

The transistors in all embodiments of the present disclosure may be thin film transistors, field effect transistors, or other devices with similar properties, and the transistors in the embodiments of the present disclosure are primarily switch transistors according to the function of the transistors in a circuit. Because a source and a drain of the switch transistor herein are symmetrical, the source and the drain are interchangeable. In the embodiments of the present disclosure, the source is referred to as a first electrode, and the drain is referred to as a second electrode. Or, the drain is referred to as the first electrode, and the source is referred to as the second electrode. According to the form in the accompanying drawings, an intermediate terminal of the transistor is a gate, a signal input terminal is the source, and a signal output terminal is the drain. Furthermore, the switch transistor in the embodiments of the present disclosure may be either a P-type switch transistor or an N-type switch transistor. The P-type switch transistor is turned on in the case that the gate is at a low level, and is turned off in the case that the gate is at a high level. The N-type switch transistor is turned on in the case that the gate is at a high level, and is turned off in the case that the gate is at a low level.

Figure 1:
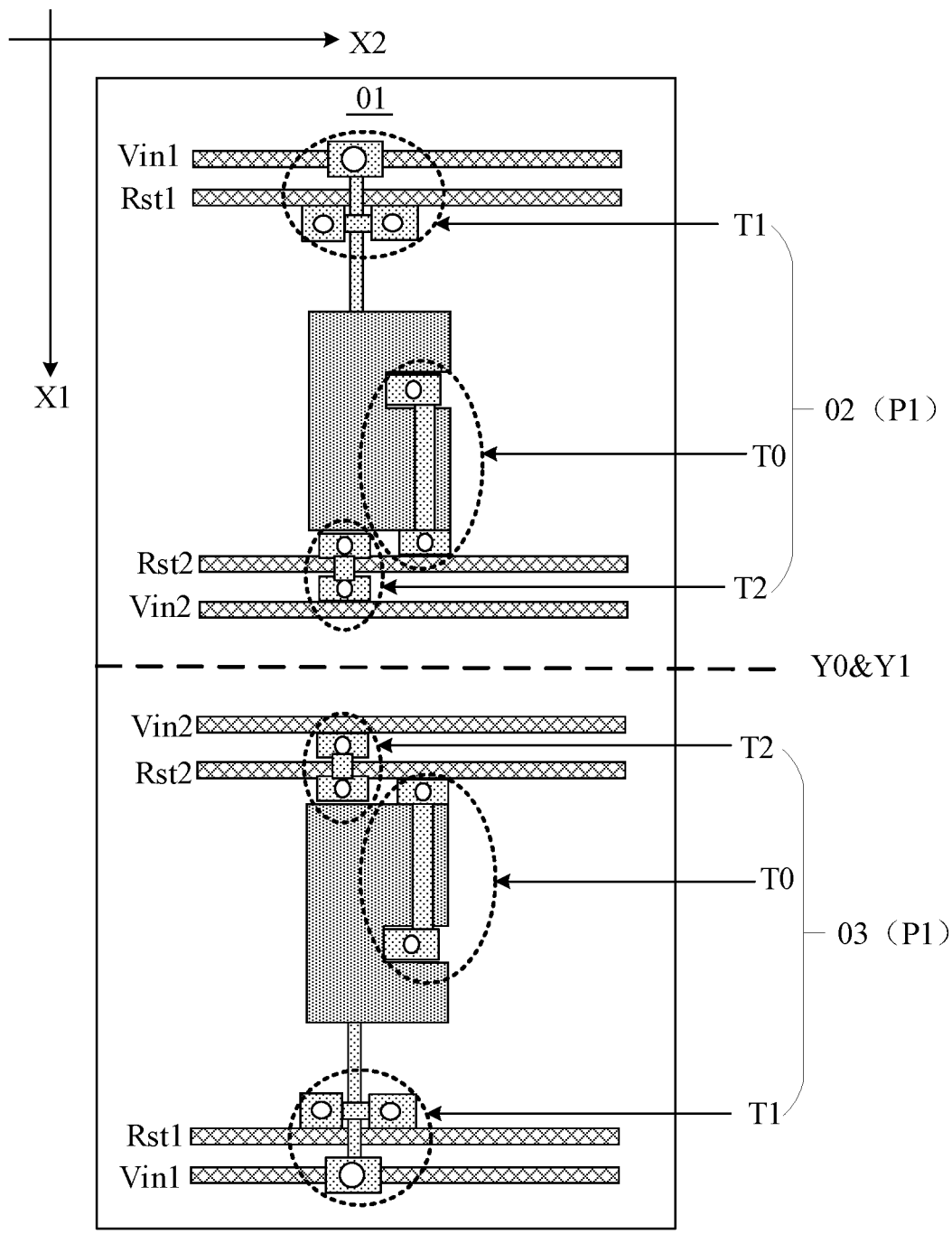
FIG. 1 is a schematic structural diagram of a display substrate including a first pixel and a second pixel according to an embodiment of the present disclosure.

FIG. 1 is a schematic structural diagram of a display substrate according to an embodiment of the present disclosure. As shown in FIG. 1, the display substrate includes a base substrate 01, and a first pixel 02 and a second pixel 03 disposed on the base substrate 01. The first pixel 02 and the second pixel 03 are arranged along the first direction X1 and are adjacent.

Figure 2:
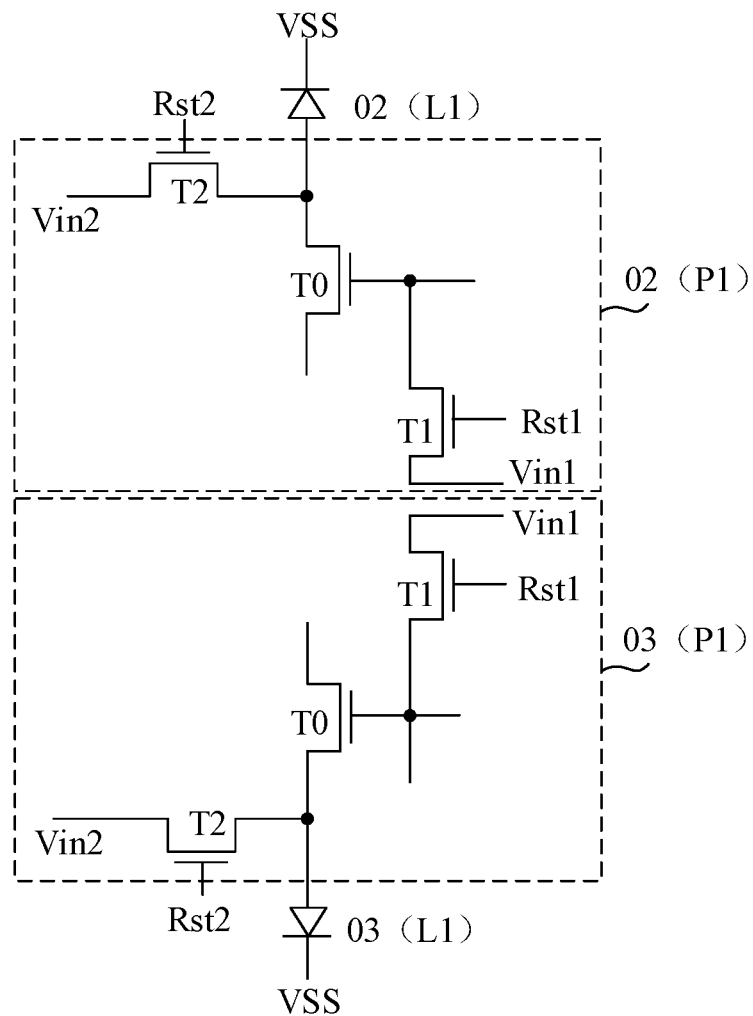
FIG. 2 is a schematic diagram of a circuit structure of a first pixel and a second pixel according to an embodiment of the present disclosure.

FIG. 2 is a schematic diagram of circuits of a first pixel 02 and a second pixel 03 according to an embodiment of the present disclosure. It can be seen in combination with FIGS. 1 and 2 that, both the first pixel 02 and the second pixel 03 include a pixel circuit P1 and a light emitting element L1, and the pixel circuit P1 is coupled to the light emitting element L1 and is configured to drive the light emitting element L1 to emit light. The pixel circuit P1 includes a drive transistor T0, a first reset transistor T1, and a second reset transistor T2.

The first reset transistor T1 is coupled to a first reset control line Rst1, a first reset signal line Vin1, and the gate of the drive transistor T0. Referring to FIG. 2, a gate of the first reset transistor T1 may be coupled to the first reset control line Rst1, a first electrode of the first reset transistor T1 may be coupled to the first reset signal line Vin1, and a second electrode of the first reset transistor T1 may be coupled to the gate of the drive transistor T0. The first reset transistor T1 is configured to, in response to a first reset control signal provided by the first reset control line Rst1, transmit a first reset signal provided by the first reset signal line Vin1 to the gate of the drive transistor T0, to reset the gate of the drive transistor T0.

The second reset transistor T2 is coupled to a second reset control line Rst2, a second reset signal line Vin2, and a first electrode of the light emitting element L1. Referring to FIG. 2, a gate of the second reset transistor T2 may be coupled to the second reset control line Rst2, a first electrode of the second reset transistor T2 may be coupled to the second reset signal line Vin2, and a second electrode of the second reset transistor T2 may be coupled to the first electrode of the light emitting element L1. The second reset transistor T2 is configured to, in response to a second reset control signal provided by the second reset control line Rst2, transmit a second reset signal provided by the second reset signal line Vin2 to the first electrode of the light emitting element L1, to reset the first electrode of the light emitting element L1.

The first reset signal line Vin1 includes a first portion extending along a second direction X2, the second direction X2 is a row direction, and the second direction X2 is intersected with the first direction X1. Correspondingly, the first direction X1 may also be referred to as a column direction. The first reset transistor T1 in the first pixel 02 and the first reset transistor T1 in the second pixel 03 are arranged symmetrically along a symmetry axis of the first portion.

The first reset signal line Vin1 corresponding to the first portion refers to the entirety of the first reset signal line Vin1 coupled to the pixel circuit P1 in the first pixel 02 and the first reset signal line Vin1 coupled to the pixel circuit P1 in the second pixel 03. Accordingly, referring to FIG. 1, the symmetry axis of the first portion refers to the axis Y0 along which the first reset signal line Vin1 coupled to the pixel circuit P1 in the first pixel 02 and the first reset signal line Vin1 coupled to the pixel circuit P1 in the second pixel 03 are symmetrical. On this basis, in combination with FIGS. 1 and 2, it can be seen that the symmetric arrangement of the first reset transistor T1 in the first pixel 02 and the first reset transistor T1 in the second pixel 03 along the symmetry axis of the first portion may refer to that the first reset transistor T1 in the first pixel 02 and the first reset transistor T1 in the second pixel 03 may be overlapped after being folded along the symmetry axis of the first portion. As such, for a display substrate including a plurality of first pixels 02 and a plurality of second pixels 03, layout and signal traces in the display substrate may be facilitated, such that a plurality of signal lines (e.g., reset signal lines and reset control lines) coupled to the pixels may be centrally disposed, which can effectively optimize the pixel space.

In summary, the embodiments of the present disclosure provide a display substrate. The display substrate includes two pixels disposed on a base substrate, arranged along a first direction and adjacent to each other. The pixel circuit in each pixel includes a drive transistor, a first reset transistor, and a second reset transistor. As the first reset transistors are arranged symmetrically along a symmetry axis of a first portion of the coupled first reset signal line, and the first portion of the first reset signal line extends along a second direction intersected with the first direction, layout and signal traces may be facilitated. For example, a plurality of signal lines coupled to the pixels may be centrally disposed, which can effectively optimize the pixel space.

Optionally, referring to FIGS. 1 and 2, it can be seen that in the embodiments of the present disclosure, the second reset transistor T2 in the first pixel 02 and the second reset transistor T2 in the second pixel 03 may further be arranged symmetrically along the symmetry axis of the first portion. That is, the second reset transistor T2 in the first pixel 02 and the second reset transistor T2 in the second pixel 03 may further be overlapped after being folded along the symmetry axis of the first portion.

Optionally, referring to FIGS. 1 and 2, it can be seen that in the embodiments of the present disclosure, the drive transistor T0 in the first pixel 02 and the drive transistor T0 in the second pixel 03 may further be arranged symmetrically along the symmetry axis of the first portion. That is, the drive transistor T0 in the first pixel 02 and the drive transistor T0 in the second pixel 03 may further be overlapped after being folded along the symmetry axis of the first portion.

Optionally, referring to FIGS. 1 and 2, it can be seen that in the embodiments of the present disclosure, the second reset signal line Vin2 may include a second portion that extends along the second direction X2. The first reset transistor T1 in the first pixel 02 and the first reset transistor T1 in the second pixel 03 may be arranged symmetrically along the symmetry axis of the second portion.

Similar to the first reset signal line Vin1, the second reset signal line Vin2 corresponding to the second portion may refer to the entirety of the second reset signal line Vin2 coupled to the pixel circuit P1 in the first pixel 02 and the second reset signal line Vin2 coupled to the pixel circuit P1 in the second pixel 03. Accordingly, it can be seen in combination with FIG. 1 that, the symmetry axis of the second portion may refer to the axis Y1 along which the second reset signal line Vin2 coupled to the pixel circuit P1 in the first pixel 02 and the second reset signal line Vin2 coupled to the pixel circuit P1 in the second pixel 03 are symmetrical. On this basis, in combination with FIG. 1, it can be seen that the symmetric arrangement of the first reset transistor T1 in the first pixel 02 and the first reset transistor T1 in the second pixel 03 along the symmetry axis of the second portion may refer to that the first reset transistor T1 in the first pixel 02 and the first reset transistor T1 in the second pixel 03 may be overlapped after being folded along the symmetry axis of the second portion.

Optionally, referring to FIGS. 1 and 2, it can be seen that in the embodiments of the present disclosure, the second reset transistor T2 in the first pixel 02 and the second reset transistor T2 in the second pixel 03 may be arranged symmetrically along the symmetry axis of the second portion. That is, the second reset transistor T2 in the first pixel 02 and the second reset transistor T2 in the second pixel 03 may further be overlapped after being folded along the symmetry axis of the second portion.

Optionally, referring to FIGS. 1 and 2, it can be seen that in the embodiments of the present disclosure, the drive transistor T0 in the first pixel 02 and the drive transistor T0 in the second pixel 03 may further be arranged symmetrically along the symmetry axis of the second portion. That is, the drive transistor T0 in the first pixel 02 and the drive transistor T0 in the second pixel 03 may further be overlapped after being folded along the symmetry axis of the second portion.

Furthermore, referring to FIGS. 1 and 2, it can be seen that the first reset control line Rst1 may extend along the second direction X2, and the second reset control line Rst2 may extend along the second direction X2.

The first reset control line Rst1 coupled to the pixel circuit P1 in the first pixel 02 and the first reset control line Rst1 coupled to the pixel circuit P1 in the second pixel 03 may be arranged symmetrically along the symmetry axis of the first portion, and may be arranged symmetrically along the symmetry axis of the second portion. That is, the first reset control line Rst1 coupled to the pixel circuit P1 in the first pixel 02 and the first reset control line Rst1 coupled to the pixel circuit P1 in the second pixel 03 may be overlapped after being folded along the symmetry axis of the first portion, and may be overlapped after being folded along the symmetry axis of the second portion.

The second reset control line Rst2 coupled to the pixel circuit P1 in the first pixel 02 and the second reset control line Rst2 coupled to the pixel circuit P1 in the second pixel 03 may be arranged symmetrically along the symmetry axis of the first portion, and may be arranged symmetrically along the symmetry axis of the second portion. That is, the second reset control line Rst2 coupled to the pixel circuit P1 in the first pixel 02 and the second reset control line Rst2 coupled to the pixel circuit P1 in the second pixel 03 may be overlapped after being folded along the symmetry axis of the first portion, and may be overlapped after being folded along the symmetry axis of the second portion.

Figure 3:
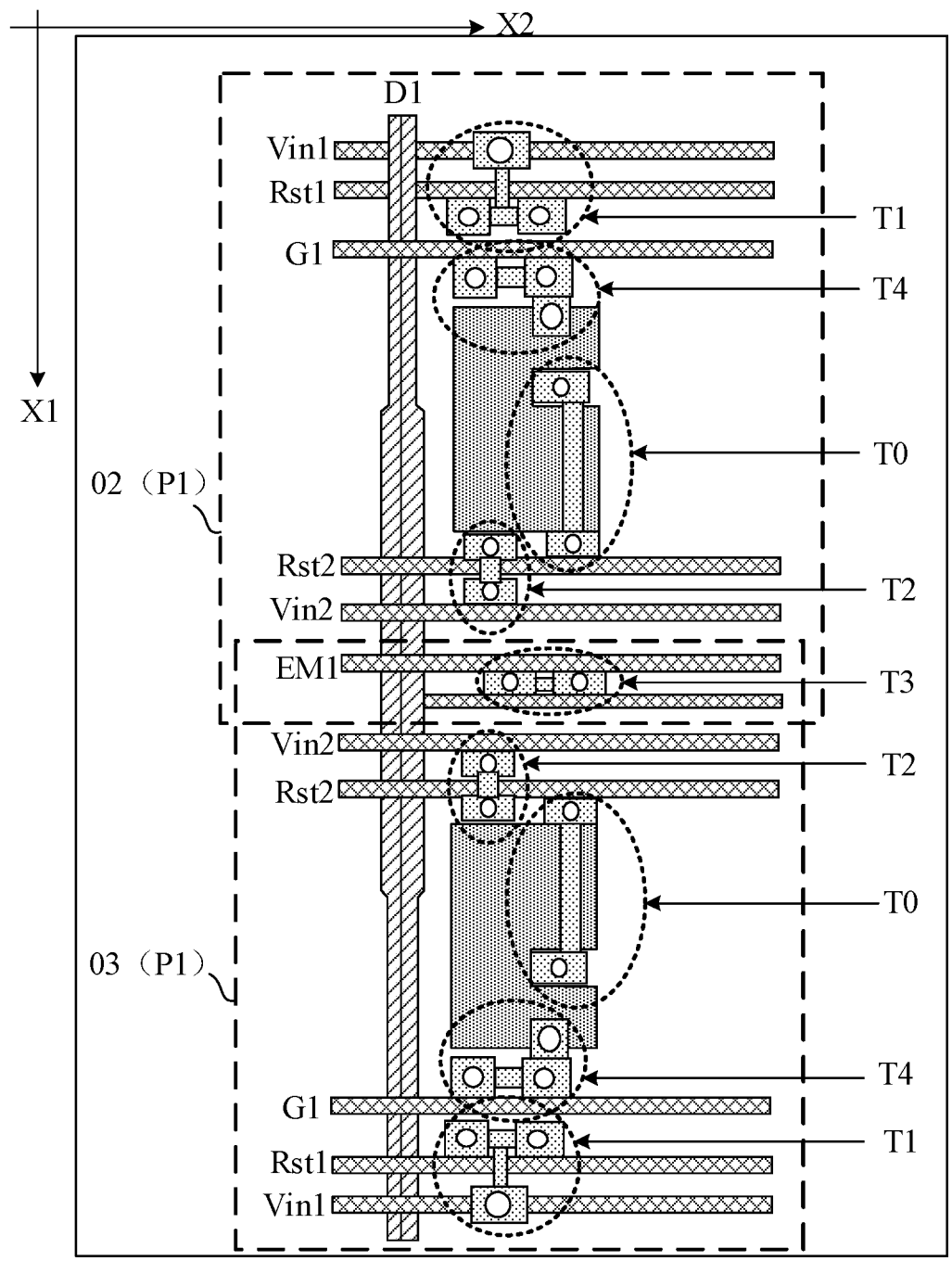
FIG. 3 is a schematic structural diagram of another display substrate including a first pixel and a second pixel according to an embodiment of the present disclosure.
Figure 4:
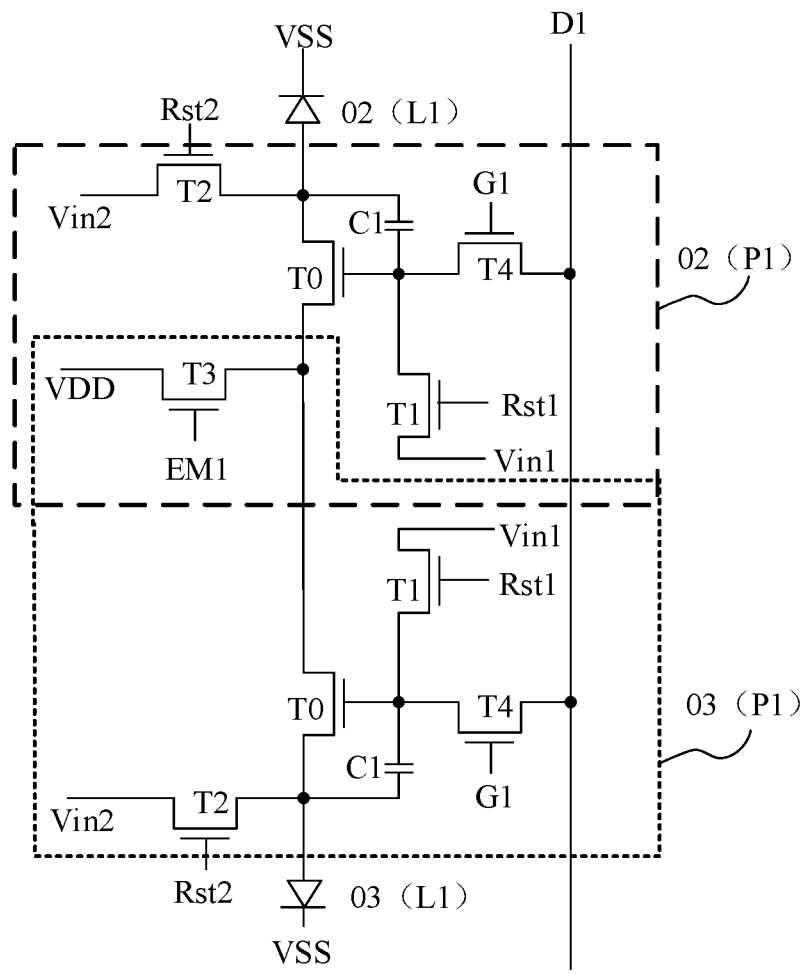
FIG. 4 is a schematic diagram of a circuit structure of a first pixel and a second pixel according to an embodiment of the present disclosure.

Optionally, FIG. 3 is a schematic structural diagram of another display substrate according to an embodiment of the present disclosure. FIG. 4 is a schematic diagram of another circuit structure of a first pixel 02 and a second pixel 03 according to an embodiment of the present disclosure. It can be seen in combination with FIGS. 3 and 4 that, the pixel circuit P1 in the first pixel 02 and the pixel circuit P1 in the second pixel 03 may further include a light emitting control transistor T3 and a data write transistor T4.

The light emitting control transistor T3 may be coupled to a light emitting control line EM1, a first power terminal VDD, and the first electrode of the drive transistor T0. For example, referring to FIG. 4, a gate of the light emitting control transistor T3 may be coupled to the light emitting control line EM1, a first electrode of the light emitting control transistor T3 may be coupled to the first power terminal VDD, and a second electrode of the light emitting control transistor T3 may be coupled to the first electrode of the drive transistor T0. The light emitting control transistor T3 may be configured to, in response to a light emitting control signal provided by the light emitting control line EM1, transmit a first power signal provided by the first power terminal VDD to the first electrode of the drive transistor T0.

The data write transistor T4 may be coupled to a gate line G1, a data line D1, and the gate of the drive transistor T0. Referring to FIG. 4, a gate of the data write transistor T4 may be coupled to the gate line G1, the first electrode of the data write transistor T4 may be coupled to the data line D1, and the second electrode of the data write transistor T4 may be coupled to the drive transistor T0. The data write transistor T4 may be configured to, in response to a gate drive signal provided by the gate line G1, transmit a data signal provided by the data line D1 to the drive transistor T0.

For example, referring to FIG. 4, the second electrode of data write transistor T4 is coupled to the gate of drive transistor T0. Accordingly, the data write transistor T4 may be configured to, in response to the gate drive signal provided by the gate line G1, transmit the data signal provided by the data line D1 to the gate of the drive transistor T0.

The second electrode of the drive transistor T0 is coupled to the first electrode of the light emitting element L1, and a second electrode of the light emitting element L1 is coupled to a second power terminal VSS. The drive transistor T0 may be configured to transmit a light emitting drive signal (e.g., a drive current) to the first electrode of the light emitting element L1 based on the potential of the gate of the drive transistor T0 and the potential of the first electrode of drive transistor T0. The light emitting element L1 may be configured to emit light based on the light emitting drive signal and a second power signal provided by the second power terminal VSS. For example, the light emitting element L1 may emit light under the potential difference between the light emitting drive signal and the second power signal.

Optionally, it can be seen in combination with FIGS. 2 and 4, the first electrode of the light emitting element L1 may be an anode, and the second electrode of the light emitting element L1 may be a cathode. In other embodiments, the first electrode of the light emitting element L1 may further be the cathode, and the second electrode of the light emitting element L1 may be the anode.

In addition, it can further be seen with reference to FIG. 4 that, the pixel circuit P1 may further include a storage capacitor C1. One end of the storage capacitor C1 may be coupled to the gate of the drive transistor T0, and the other end of the storage capacitor C1 may be coupled to the second electrode of the drive transistor T0. The storage capacitor C1 may be configured to adjust the potential of the gate of the drive transistor T0 and the potential of the first electrode of the drive transistor T0.

It should be noted that the above description merely schematically illustrates an optional structure of pixel circuit P1, which is a 5T1C (i.e., five transistors and one capacitor) structure. The structure of the pixel circuit P1 is not limited in the embodiments of the present disclosure, and may further be other structures, such as a 7T1C structure.

Optionally, it can be seen in combination with FIGS. 3 and 4 that, in the embodiments of the present disclosure, the light emitting control transistor T3 in the pixel circuit P1 in the first pixel 02 and the light emitting control transistor T3 in the pixel circuit P1 in the second pixel 03 may be the same transistor. That is, the first pixel 02 and the second pixel 03 share a light emitting control transistor T3. Accordingly, the first pixel 02 and the second pixel 03 may share the same light emitting control line EM1. As such, compared with the related art, the number of light emitting control circuits required in the display substrate may be reduced, and the number of the light emitting control lines may be reduced, such that the area, occupied by each pixel, of the base substrate is small. Furthermore, other drive circuits (e.g., gate drive circuits) that provide signals to the signal lines to which the pixels are coupled, and the drive signal lines to which the gate drive circuits are coupled can be disposed on the base substrate. Therefore, the resolution of the display substrate may be greater.

In addition, referring to FIG. 3, it can be seen that the light emitting control transistor T3 shared by the first pixel 02 and the second pixel 03 may be disposed between the second reset signal line Vin2 coupled to the pixel circuit P1 in the first pixel 02 and the second reset signal line Vin2 coupled to the pixel circuit P1 in the second pixel 03.

Optionally, it can be seen with reference to FIGS. 3 and 4 that, the data write transistor T4 in the first pixel 02 and the data write transistor T4 in the second pixel 03 may further be arranged symmetrically along the symmetry axis of the first portion. That is, the data write transistor T4 in the first pixel 02 and the data write transistor T4 in the second pixel 03 may further be overlapped after being folded along the symmetry axis of the first portion.

Optionally, it can be seen with reference to FIGS. 3 and 4 that, the data write transistor T4 in the first pixel 02 and the data write transistor T4 in the second pixel 03 may further be arranged symmetrically along the symmetry axis of the second portion. That is, the data write transistor T4 in the first pixel 02 and the data write transistor T4 in the second pixel 03 may further be overlapped after being folded along the symmetry axis of the second portion.

Optionally, it can be seen in combination with FIG. 3 that, the gate line G1 may extend along the second direction X2. The data line D1 may extend along the first direction X1. The gate line G1 coupled to the pixel circuit P1 in the first pixel 02 and the gate line G1 coupled to the pixel circuit P1 in the second pixel 03 may be arranged symmetrically along the symmetry axis of the first portion, and may be arranged symmetrically along the symmetry axis of the second portion. That is, the gate line G1 coupled to the pixel circuit P1 in the first pixel 02 and the gate line G1 coupled to the pixel circuit P1 in the second pixel 03 may be overlapped after being folded along the symmetry axis of the first portion, and may be overlapped after being folded along the symmetry axis of the second portion.

Optionally, it can be seen with reference to FIG. 3 that similar to the first reset control line Rst1 and the second reset control line Rst2, the light emitting control line EM1 may further extend along the second direction X2. The symmetry axis Y0 of the first portion of the first reset signal line Vin1 and the symmetry axis Y1 of the second portion of the second reset signal line Vin2 may be overlapped with each other. In combination with FIG. 3, both the symmetry axis of the first portion of the first reset signal line Vin1 and the symmetry axis of the second portion of the second reset signal line Vin2 may be overlapped with the light emitting control line EM1. In other words, the light emitting control line EM1 extending along the second direction X2 may serve as the symmetry axis of the first portion, and may serve as the symmetry axis of the second portion, which may further facilitate the layout and signal traces in the display substrate.

In addition, referring to FIG. 3, it can be seen that the first reset signal line Vin1, the first reset control line Rst1, the gate line G1, the second reset control line Rst2, the second reset signal line Vin2, and the light emitting control line EM1 coupled to the pixel circuit P1 in one of the first pixel 02 and the second pixel 03 may be arranged sequentially along a direction going close to the other one of the first pixel 02 and the second pixel 03. In the pixel circuit P1 in one of the first pixel 02 and the second pixel 03, the first reset transistor T1, the data write transistor T4, the drive transistor T0, the second reset transistor T2, and the light emitting control transistor T3 may be arranged sequentially along the direction going close to the other one of the first pixel 02 and the second pixel 03. In addition, the first reset transistor T1, the data write transistor T4, the drive transistor T0, and the second reset transistor T2 may all be disposed between the first reset signal line Vin1 and the second reset signal line Vin2.

Optionally, it can be seen in combination with FIGS. 1 to 4 that, the first direction X1 and the second direction X2 in the present disclosure may be perpendicular to each other.

Figure 5:
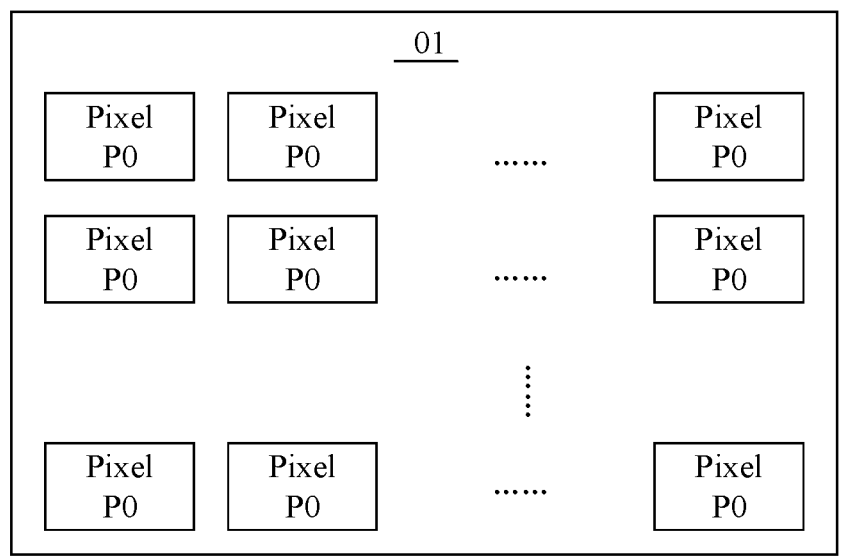
FIG. 5 is a schematic structural diagram of a display substrate according to an embodiment of the present disclosure.

FIG. 5 is a schematic structural diagram of yet another display substrate according to an embodiment of the present disclosure. As shown in FIG. 5, the display substrate may include a base substrate 01, and a plurality of pixels P0 arranged in an array on the base substrate 01. The plurality of pixels P0 may include the first pixel 02 and the second pixel 03 as shown in any of FIGS. 1 to 4.

Figure 6:
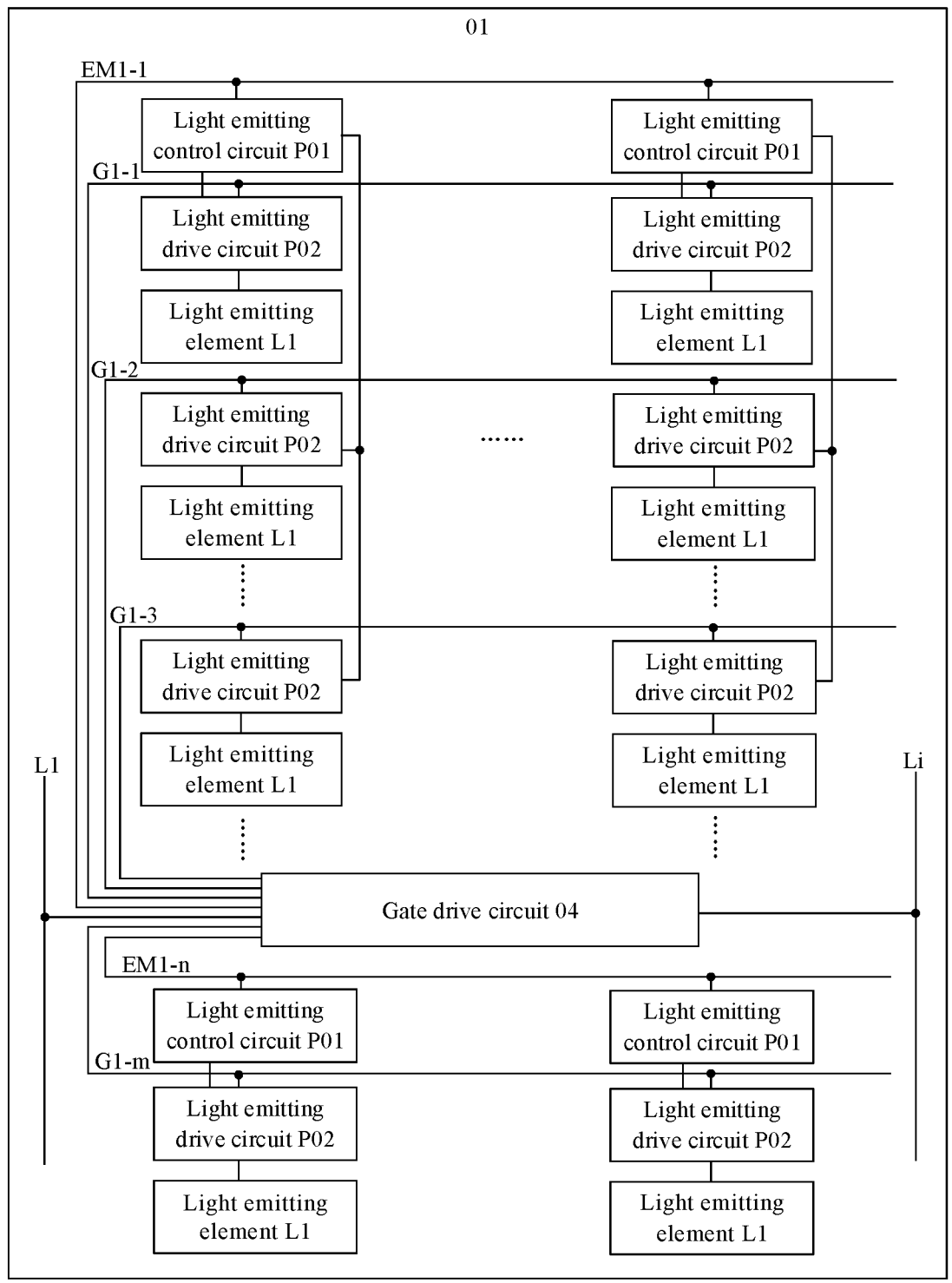
FIG. 6 is a schematic structural diagram of another display substrate according to an embodiment of the present disclosure.

FIG. 6 is a schematic structural diagram of yet another display substrate according to an embodiment of the present disclosure. It can be seen in combination with FIGS. 5 and 6 that, the pixel P0 may include a light emitting control circuit P01, a light emitting drive circuit P02, and a light emitting element L1, and at least two pixels P0 may share the same light emitting control circuit P01, that is, at least two pixels P0 may operate under the driving of the same light emitting control circuit P01.

For the first pixel 02 and the second pixel 03 described in the above embodiments, the pixel circuit P1 may include a light emitting control circuit P01 and a light emitting drive circuit P02. The light emitting control circuit P01 may include a light emitting control transistor T3. The light emitting drive circuit P02 may include a data write transistor T4, a first reset transistor T1, a second reset transistor T2, a drive transistor T0, and a storage capacitor C1. It can be seen in combination with FIGS. 3 and 4 that, at least two pixels P0 sharing the same light emitting control circuit P01 may refer to that the first pixel 02 and the second pixel 03 share the same light emitting control transistor T3. Furthermore, the first direction X1 described in the above embodiments may be the column direction, and the second direction X2 may be the row direction.

Referring to FIG. 6, it can be seen that the display substrate may further include a gate drive circuit 04, a plurality of light emitting control lines (e.g., from EM1-1 to EM1-$n$ shown in FIG. 6), a plurality of gate lines (e.g., from G1-1 to G1-$m$ shown in FIG. 6), and a plurality of drive signal lines (from L1 to Li shown in FIG. 6) that are disposed on the base substrate 01.

The gate drive circuit 04 may be coupled to the plurality of drive signal lines, the plurality of light emitting control lines, and the plurality of gate lines. The plurality of light emitting control lines may be coupled to the light emitting control circuits P01 in the pixels P0, and the plurality of gate lines may be coupled to the light emitting drive circuits P02 in the pixels P0. The gate drive circuit 04 may be configured to output, in response to drive signals provided by the plurality of drive signal lines, light emitting control signals to the plurality of light emitting control lines, and gate drive signals to the plurality of gate lines. That is, the gate drive circuit 04 may operate under the drive of the drive signals provided by the plurality of drive signal lines.

Optionally, the plurality of rows of pixels P0 and the plurality of gate lines may generally be coupled in one-to-one correspondence, and the plurality of rows of pixels P0 and the plurality of light emitting control lines may further be coupled in one-to-one correspondence. That is, in the plurality of pixels P0 in the same row, the light emitting control circuits P01 in the pixels P0 may be coupled to the same light emitting control line, and the light emitting drive circuits P02 in the pixels P0 may be coupled to the same gate line. Accordingly, the number of the gate lines and the number of rows of pixels in the display substrate are the same in the embodiments of the present disclosure. Because at least two pixels P0 may share the same light emitting control circuit P01, the number of light emitting control circuits P01 required to be set may be reduced when the at least two pixels P0 are in the same row; and the number of light emitting control circuits P01 required to be set and the number of light emitting control lines required to be set may be reduced when the at least two pixels P0 are in the same column. As such, the effect of optimizing the pixel space is achieved without affecting the normal display of the pixels P0, that is, the area occupied by the pixels P0 on the base substrate 01 is reduced, compared with in the related art. Therefore, the area of the remaining region of the base substrate 01 is increased, and the remaining region may be configured to reliably dispose the gate drive circuit 04 and the drive signal lines to be coupled to the gate drive circuit 04. Thus, the display substrate with the gate drive circuit 04 disposed in the substrate is obtained, that is, a gate drive in array (GIA) display substrate is obtained.

For any of the first pixel 02 and the second pixel 03 as described in combination with FIG. 3, the coupled gate line G1 is a gate line in G1-1 to G1-$m$ shown in FIG. 6; and the coupled light emitting control line EM1 is a light emitting control line in EM1-1 to EM1-$n$ as shown in FIG. 6.

In addition, with continuous reference to FIG. 6, it can be seen that, in each pixel P0, the light emitting control circuit P01 may further be coupled to the light emitting drive circuit P02, and the light emitting drive circuit P02 may further be coupled to the light emitting element L1. The light emitting control circuit P01 may be configured to output, in response to the light emitting control signal provided by the coupled light emitting control line, a DC power signal to the coupled light emitting drive circuit P02. The light emitting drive circuit P02 may be configured to output, in response to the gate drive signal provided by the coupled gate line and the received DC power signal, the drive signal (for example, the drive current) to the coupled light emitting element L1, to drive the light emitting element L1 to emit light.

That is, by taking the first pixel 02 as an example, the light emitting control transistor T3 may be coupled to the first electrode of the drive transistor T0. The light emitting drive circuit P02 including the drive transistor T0, the first reset transistor T1, the second reset transistor T2, the data write transistor T4, and the storage capacitor C1 may be coupled to the light emitting element L1. The light emitting control transistor T3 may output, in response to a light emitting control signal provided by the coupled lighting control line EM1, a first power signal to the first electrode of the drive transistor T0, and the first power signal may be a DC power signal. The light emitting drive circuit P02 may output, in response to the signal provided by the other signal lines (e.g., data lines) coupled and the first power signal, a light emitting drive signal to the light emitting element L1, to drive the light emitting element L1 to emit light.

Optionally, it can be seen in combination with FIG. 6 that, in the embodiment of the present disclosure, the at least two pixels P0 sharing the same light emitting control circuit P01 may be disposed in the same column. As such, in combination with the embodiments described above, compared with the related art, not only the number of the light emitting control circuits P01 required to be set on the base substrate 01 may be reduced, but also the number of the light emitting control lines required to be set on the base substrate 01 may be reduced.

For example, assuming that the display substrate includes m rows of pixels P0, in the case that at least two pixels P0 in the same column share the same light emitting control circuit P01, the number of the light emitting control lines disposed on the base substrate 01 is less than the number of rows of the pixels P0. That is, n is less than m in FIG. 6, and both m and n may be an integer greater than 1.

Optionally, the at least two pixels P0 sharing the same light emitting control circuit P01 not only are in the same column, bur also may be adjacent, which may be convenient for the layout and signal trace.

Figure 7:
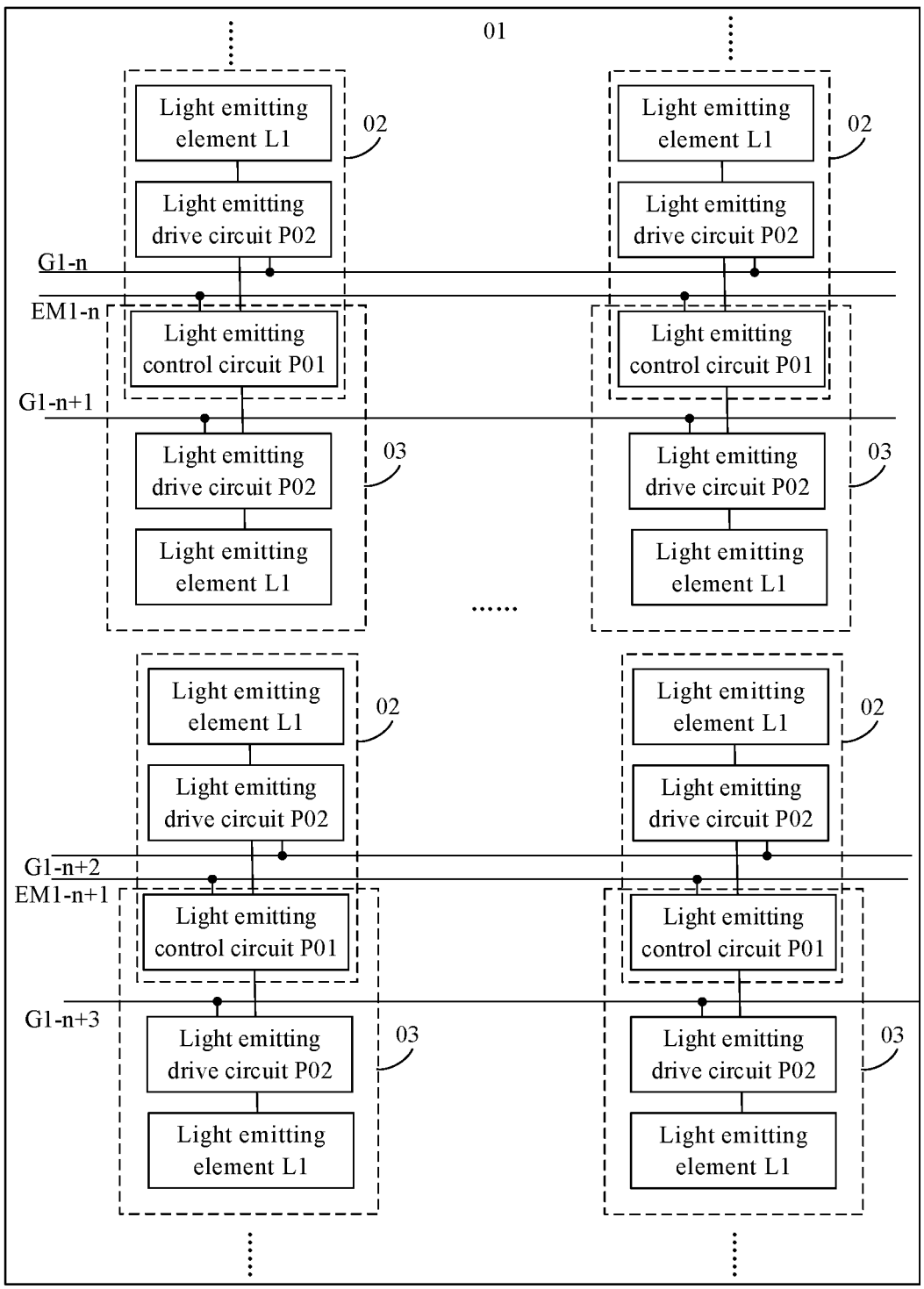
FIG. 7 is a schematic structural diagram of yet another display substrate according to an embodiment of the present disclosure.

For example, FIG. 7 shows yet another display substrate by taking an example in which each two adjacent pixels P0 in the same column share the same light emitting control circuit P01. FIG. 7 schematically shows that the pixel P0 in the $n^{th}$ row and the pixel P0 in the $(n+1)^{th}$ row which are adjacent share the same light emitting control circuit P01, and the pixel P0 in the $(n+2)^{th}$ row and the pixel P0 in the $(n+3)^{th}$ row which are adjacent share the same light emitting control circuit P01. It can be further seen in combination with FIG. 7 that, adjacent two pixels P0 may also share the same light emitting control line (e.g., EM1-$n$ and EM1-$n$+1) in the case that the two pixels P0 sharing the same light emitting control circuit P01 are in the same column.

In addition, the two pixels P0 sharing the same light emitting control circuit P01 may be symmetrically arranged on two sides of the light emitting control line EMn coupled to the shared light emitting control circuit P01. That is, in the two pixels P0, transistors in one pixel P0 and coupled signal lines, and transistors in the other pixel P0 and coupled signal lines may be symmetrically disposed on two sides of the light emitting control line EMn. In such a design, not only the layout and the signal trace are convenient, but also the signal lines may be centrally disposed, thereby further optimizing the pixel space.

Every two pixels P0 in the same column and adjacent to each other shown in FIG. 7 may be the first pixel 02 and the second pixel 03 described in the embodiments of FIGS. 3 and 4. It can further be seen in combination with FIGS. 3 and 4 that, the first pixel 02 and the second pixel 03 share the same light emitting control line EM1 and the same light emitting control transistor T3. The first pixel 02 and the second pixel 03 may be symmetrically arranged on two sides of the light emitting control line EM1 coupled to the shared light emitting control transistor T3. For the symmetrical arrangement, reference may be made to the embodiments described above with respect to FIGS. 3 and 4, which is not repeated herein.

Referring to FIGS. 3 to 7, in the embodiments of the present disclosure, to reliably drive the light emitting element L1 to emit light, the display substrate may further include a data line D1, a first reset control line Rst1, a second reset control line Rst2, a first reset signal line Vin1, a second reset signal line Vin2, and a first power line coupled to the first power terminal VDD and a second power line coupled to the second power terminal VSS which are disposed on the base substrate 01.

The number of the data lines D1 and the number of columns of the pixels may be same, the number of the gate lines G1, the number of the first reset control line Rst1, and the number of the second reset control line Rst2 may be equal to the number of rows of the pixels. As FIG. 3 and FIG. 4 take two pixels as an example, FIGS. 3 and 4 merely show one data line D1, two gate lines G1, two first reset control lines Rst1, and two second reset control lines Rst2.

With reference to FIG. 4 as described in the above embodiments, the gate of the data write transistor T4 may be coupled to one gate line G1, the first electrode of the data write transistor T4 may be coupled to the gate of the drive transistor T0, and the second electrode of the data write transistor T4 may be coupled to one data line D1. The first electrode of the drive transistor T0 may be coupled to the first electrode of the light emitting control transistor T1, the second electrode of the drive transistor T0 may be coupled to the first electrode of the light emitting element L1, and the second electrode of the light emitting element L1 may further be coupled to the second power terminal VSS. The gate of the light emitting control transistor T3 may be coupled to one light-emitting control line EM1, and the second electrode of the light emitting control transistor T3 may be coupled to the second power terminal VDD. The gate of the first reset transistor T1 may be coupled to the first reset control line Rst1, the first electrode of the first reset transistor T1 may be coupled to the first reset signal line Vin1, and the second electrode of the first reset transistor T1 may be coupled to the gate of the drive transistor T0. The gate of the second reset transistor T2 may be coupled to one second reset control line Rst2, the first electrode of the second reset transistor T2 may be coupled to the second reset signal line Vin2, and the second electrode of the second reset transistor T2 may be coupled to the first electrode of the light emitting element L1.

The following embodiments all illustrate an optional structure of the display substrate by taking an example in which each two adjacent pixels P0 in the same column share the same light emitting control circuit P01 (i.e., the structures in FIG. 3 and FIG. 4).

Optionally, in the embodiments of the present disclosure, the drive signal lines coupled to the gate drive circuit 04 may each be disposed between two adjacent columns of pixels P0. For example, referring to FIG. 8, which shows yet another display substrate, because each two adjacent pixels P0 in the same column share the same light emitting control circuit P01, an additional region is reserved between each two adjacent columns of pixels P0, such as region 5 and region 6 shown in FIG. 8. Correspondingly, the drive signal lines coupled to the gate drive circuit 04 may be disposed in the region 5 and region 6.

Optionally, as the region between each two adjacent columns of pixels P0 is limited, at most two drive signal lines may be disposed between each two adjacent columns of pixels P0 to reliably set the drive signal lines.

In the embodiments of the present disclosure, the gate drive circuit 04 may include a plurality of cascaded shift register units 041. At least two cascaded shift register units 041 may be disposed between two adjacent rows of pixels P0.

Figure 8:
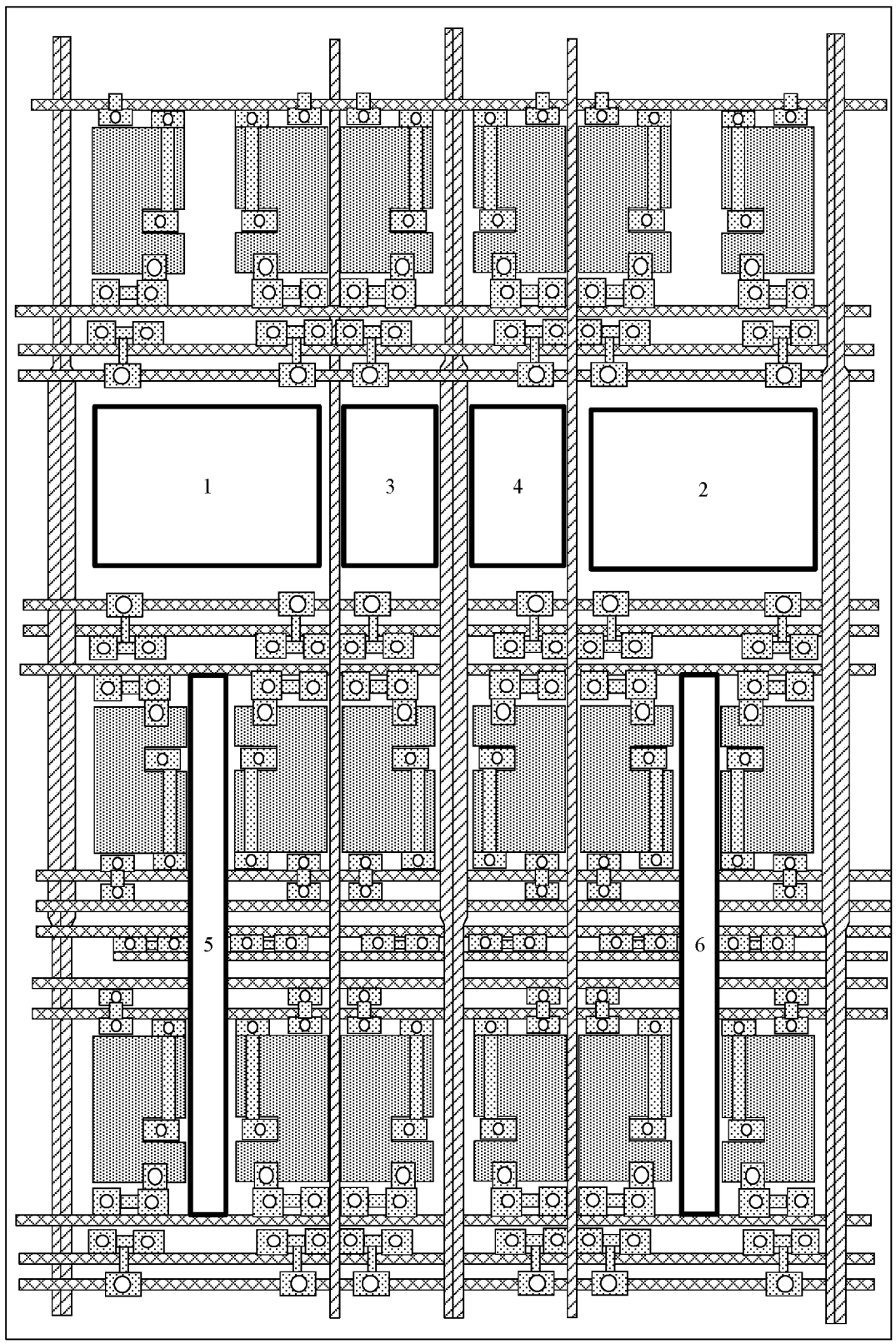
FIG. 8 is a schematic structural diagram of yet another display substrate according to an embodiment of the present disclosure.

For example, referring to FIG. 8, because each two adjacent pixels P0 in the same column share the same light emitting control circuit P01, an additional region is reserved between each two adjacent rows of pixels P0, such as region 1, region 2, region 3, and region 4 shown in FIG. 8. Correspondingly, at least two cascaded shift register units 041 may be disposed in regions 1 to 4 between each two adjacent rows of pixels P0.

Furthermore, to facilitate the signal trace, in combination with FIG. 8, at least two cascaded shift register units 041 may be disposed between two adjacent rows of target pixels P0. In the two rows of target pixels P0, the light emitting control circuit coupled to one row of target pixels P0 is different from the light emitting control circuit coupled to the other row of target pixels P0. That is, the at least two cascaded shift register units 041 may be disposed between two rows of pixels P0 that do not share light emitting control circuits P01.

Figure 9:
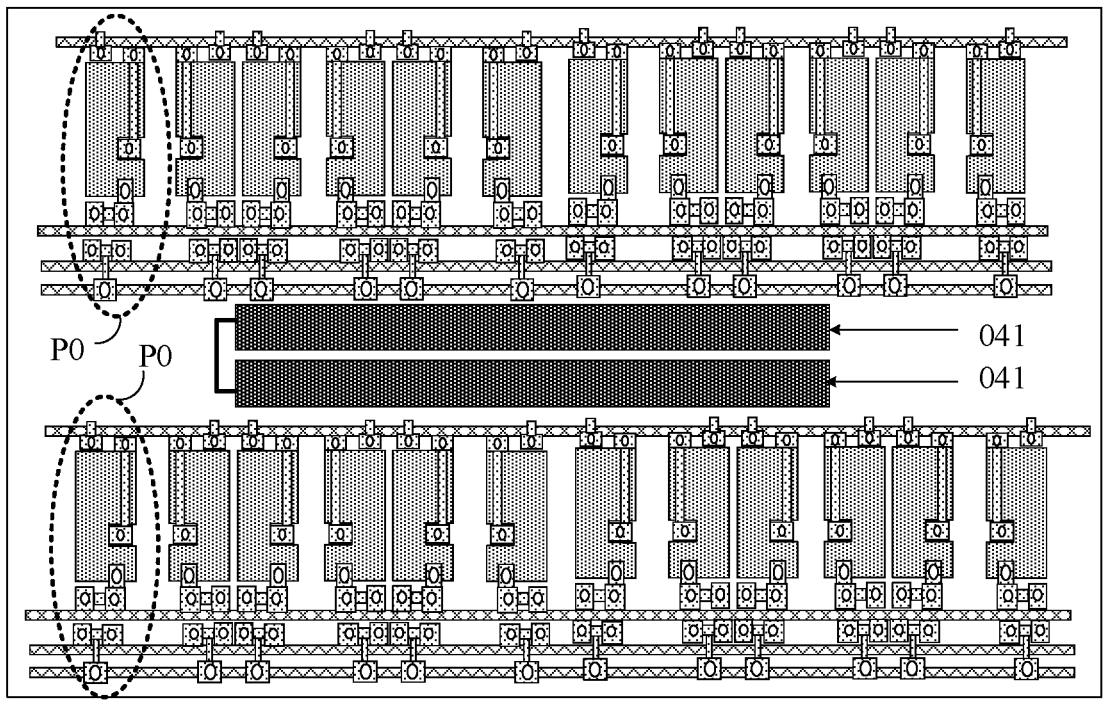
FIG. 9 is a schematic structural diagram of yet another display substrate according to an embodiment of the present disclosure.

FIG. 9 is a schematic structural diagram of yet another display substrate according to an embodiment of the present disclosure. As shown in FIG. 9, only two cascaded shift register units 041 may be disposed between each two adjacent rows of target pixels P0. One shift register unit 041 may be coupled to one row of target pixels P0, and the other shift register unit 041 may be coupled to the other row of target pixels P0 (not shown in FIG. 9).

Optionally, the two cascaded shift register units 041 may be symmetrically arranged between the two rows of target pixels. That is, the transistors in one shift register unit 041 are disposed symmetrically with the transistors in the other shift register unit 041. As such, some drive signal lines (e.g., a power signal line providing a DC signal) may be shared, thereby further optimizing the GIA space, that is, reducing the area, occupied by the shift register units 041, of the base substrate 01.

Figure 10:
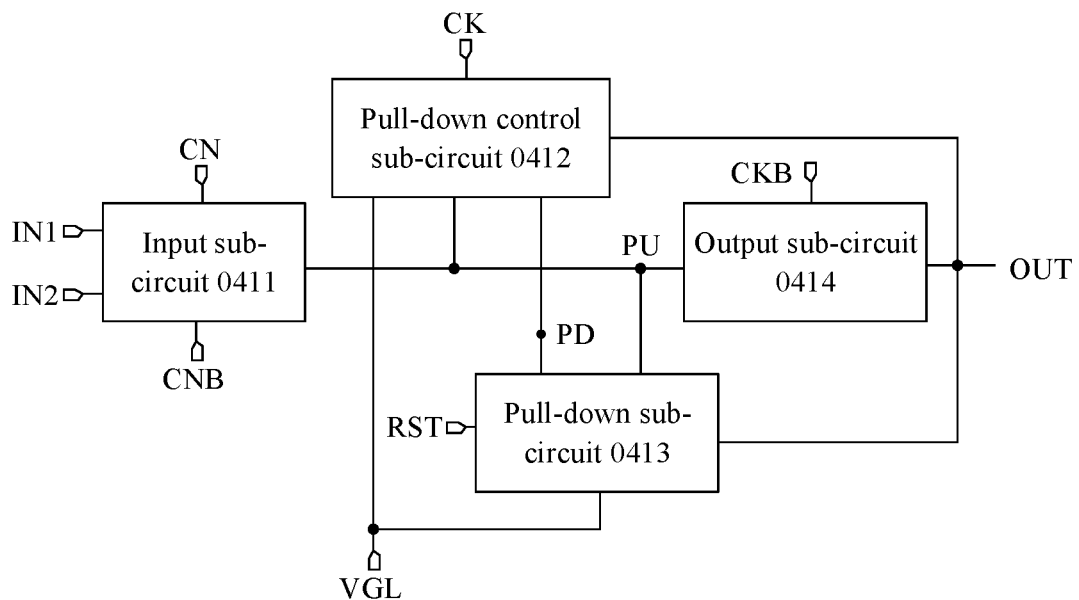
FIG. 10 is a schematic structural diagram of a shift register unit according to an embodiment of the present disclosure.

FIG. 10 is a schematic structural diagram of a shift register unit according to an embodiment of the present disclosure. As shown in FIG. 10, the shift register unit 041 may include an input sub-circuit 0411, a pull-down control sub-circuit 0412, a pull-down sub-circuit 0413, and an output sub-circuit 0414.

The input sub-circuit 0411 may be coupled to a first input terminal IN1, a second input terminal IN2, a first control signal terminal CN, a second control signal terminal CNB, and a pull-up node PU. The input sub-circuit 0411 may be configured to output, in response to a first input signal provided by the first input terminal IN1, a first control signal provided by the first control signal terminal CN to the pull-up node PU, and output, in response to a second input signal provided by the second input terminal IN2, a second control signal provided by the second control signal terminal CNB to the pull-up node PU.

For example, the input sub-circuit 0411 may output the first control signal provided by the first control signal terminal CN to the pull-up node PU when a potential of the first input signal provided by the first input terminal IN1 is a first potential, and output the second control signal provided by the second control signal terminal CNB to the pull-up node PU when a potential of the second input signal provided by the second input terminal IN2 is the first potential.

Optionally, the first input terminal IN1 may be coupled to an output terminal of the previous stage of shift register unit 041, and the second input terminal IN2 may be coupled to an output terminal of the next stage of shift register unit 041. A potential of the first control signal and a potential of the second control signal may be complementary. That is, the potential of the second control signal is the second potential when the potential of the first control signal is the first potential, and the potential of the second control signal is the first potential when the potential of the first control signal is the second potential. The first potential may be an effective potential, and the second potential may be an ineffective potential. In the case that the transistor is an N-type transistor, the first potential may be a high potential relative to the second potential; and in the case that the transistor is a P-type transistor, the first potential may be a low potential relative to the second potential.

Additionally, for the first stage of shift register unit 041, the previous stage of shift register unit 041 is not present, and for the last stage of shift register unit 041, the next stage of shift register unit 041 is not present. Therefore, in order to ensure normal operation of the gate drive circuit 04, the first stage of shift register unit 041 and the last stage of shift register unit 041 may be coupled to an initial signal terminal. The initial signal terminal may be configured to provide an initial signal at the first potential for the first input terminal IN1 coupled to the first stage of shift register unit 041, and provide an initial signal at the first potential for the second input terminal IN2 coupled to the last stage of shift register unit 041, thereby ensuring normal operation of the first stage of shift register unit 041 and the last stage of shift register unit 041.

The pull-down control sub-circuit 0412 may be coupled to a first clock signal terminal CK, the pull-up node PU, a pull-down power terminal VGL, a pull-down node PD, and an output terminal OUT. The pull-down control sub-circuit 0412 may be configured to output, in response to a first clock signal provided by the first clock signal terminal CK, the first clock signal to the pull-down node PD, and output, in response to a potential of the pull-up node PU and an output signal provided by the output terminal OUT, a pull-down power signal provided by the pull-down power terminal VGL to the pull-down node PD.

For example, the pull-down control sub-circuit 0412 may output a first clock signal to the pull-down node PD when a potential of the first clock signal provided by the first clock signal terminal CK is the first potential, to charge the pull-down node PD. The pull-down control sub-circuit 0412 may output the pull-down power signal provided by the pull-down power terminal VGL to the pull-down node PD when a potential of the pull-up node PU is the first potential. The potential of the pull-down power signal may be the second potential, to denoise the pull-down node PD. The pull-down control sub-circuit 0412 may output the pull-down power signal to the pull-down node PD when the potential of the output signal provided by the output terminal OUT is the first potential, to denoise the pull-down node PD.

The pull-down sub-circuit 0413 may be coupled to a reset signal terminal RST, the pull-down node PD, the pull-down power terminal VGL, the pull-up node PU, and the output terminal OUT. The pull-down sub-circuit 0413 may be configured to output, in response to the potential of the pull-down node PD, the pull-down power signal to the pull-up node PU and the output terminal OUT, and output, in response to a reset signal provided by the reset signal terminal RST, the pull-down power signal to the pull-up node PU.

For example, the pull-down sub-circuit 0413 may output the pull-down power signal to the pull-up node PU and the output terminal OUT when the potential of the pull-down node PD is the first potential to denoise the pull-up node PU and the output terminal OUT, and output the pull-down power signal to the pull-up node PU when the potential of the reset signal provided by the reset signal terminal RST is the first potential to denoise the pull-up node PU.

The output sub-circuit 0414 may be coupled to the pull-up node PU, a second clock signal terminal CKB, and the output terminal OUT. The output sub-circuit 0414 may be configured to output, in response to the potential of the pull-up node PU, a second clock signal provided by the second clock signal terminal CKB to the output terminal OUT.

For example, the output sub-circuit 0414 may output the second clock signal provided by the second clock signal terminal CKB to the output OUT when the potential of the pull-up node PU is the first potential. The second clock signal may be provided for the gate line as a gate drive signal, or provided for the light emitting control line as a light emitting control signal.

Figure 11:
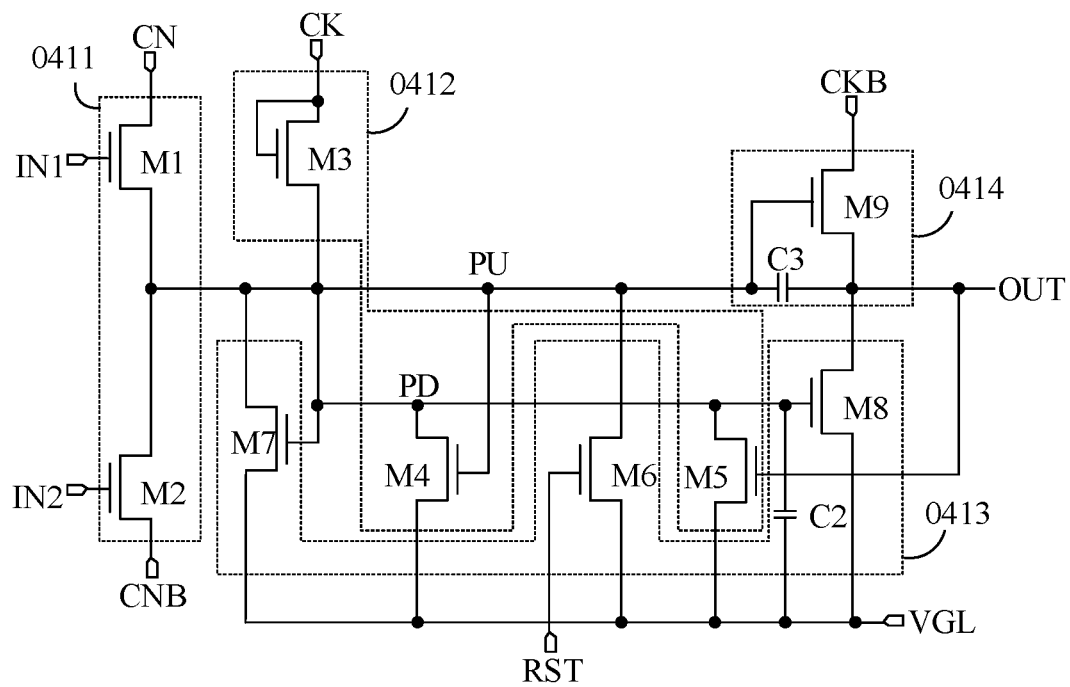
FIG. 11 is a schematic structural diagram of another shift register unit according to an embodiment of the present disclosure.

FIG. 11 is a schematic structural diagram of another shift register unit according to an embodiment of the present disclosure. As shown in FIG. 11, the input sub-circuit 0411 may include a first input transistor M1 and a second input transistor M2. The pull-down control sub-circuit 0412 may include a first pull-down control transistor M3, a second pull-down control transistor M4, and a third pull-down control transistor M5. The pull-down sub-circuit 0413 may include a first pull-down transistor M6, a second pull-down transistor M7, a third pull-down transistor M8, and a pull-down capacitor C2. The output sub-circuit 0414 may include an output transistor M9 and an output capacitor C3.

A gate of the first input transistor M1 may be coupled to the first input terminal IN1, a first electrode of the first input transistor M1 may be coupled to the first control signal terminal CN, and a second electrode of the first input transistor M1 may be coupled to the pull-up node PU. Correspondingly, the first input transistor M1 may output the first control signal provided by the first control signal terminal CN to the pull-up node PU when the potential of the first input signal provided by the first input terminal IN1 is the first potential to charge the pull-up node PU.

A gate of the second input transistor M2 may be coupled to the second input terminal IN2, a first electrode of the second input transistor M2 may be coupled to the second control signal terminal CNB, and a second electrode of the second input transistor M2 may be coupled to the pull-up node PU. Correspondingly, the second input transistor M2 may output the second control signal provided by the second control signal terminal CNB to the pull-up node PU when the potential of the second input signal provided by the second input terminal IN2 is the first potential to reset the pull-up node PU.

Both a gate and a first electrode of the first pull-down control transistor M3 may be coupled to the first clock signal terminal CK, and a second electrode of the first pull-down control transistor M3 may be coupled to the pull-down node PD. Correspondingly, the first pull-down control transistor M3 may output the first clock signal to the pull-down node PD when the potential of the first clock signal provided by the first clock signal terminal CK is the first potential to charge the pull-down node PD.

A gate of the second pull-down control transistor M4 may be coupled to the pull-up node PU, a first electrode of the second pull-down control transistor M4 may be coupled to the pull-down power terminal VGL, and a second electrode of the second pull-down control transistor M4 may be coupled to the pull-down node PD. Correspondingly, the second pull-down control transistor M4 may output the pull-down power signal to the pull-down node PD when the potential of the pull-up node PU is the first potential to denoise the pull-down node PD.

A gate of the third pull-down control transistor M5 may be coupled to the output terminal OUT, a first electrode of the third pull-down control transistor M5 may be coupled to the pull-down power terminal VGL, and a second electrode of the third pull-down control transistor M5 may be coupled to the pull-down node PD. Correspondingly, the third pull-down control transistor M5 may output the pull-down power signal to the pull-down node PD when the potential of the output signal provided by the output terminal OUT is the first potential to denoise the pull-down node PD.

A gate of the first pull-down transistor M6 may be coupled to the reset signal terminal RST, a first electrode of the first pull-down transistor M6 may be coupled to the pull-down power terminal VGL, and a second electrode of the first pull-down transistor M6 may be coupled to the pull-up node PU. Correspondingly, the first pull-down transistor M6 may output the pull-down power signal provided by the pull-down power terminal VGL to the pull-up node PU when the potential of the reset signal provided by the reset signal terminal RST is the first potential to denoise the pull-up node PU.

Both a gate of the second pull-down transistor M7 and a gate of the third pull-down transistor M8 may be coupled to the pull-down node PD, both a first electrode of the second pull-down transistor M7 and a first electrode of the third pull-down transistor M8 may be coupled to the pull-down power terminal VGL, a second electrode of the second pull-down transistor M7 may be coupled to the pull-up node PU, and a second electrode of the third pull-down transistor M8 may be coupled to the output terminal OUT. Correspondingly, the second pull-down transistor M7 may output the pull-down power signal to the pull-up node PU when the potential of the pull-down node PD is the first potential to denoise the pull-up node PU. The third pull-down transistor M8 may output the pull-down power signal to the output terminal OUT when the potential of the pull-down node PD is the first potential to denoise the output terminal OUT.

One end of the pull-down capacitor C2 may be coupled to the pull-down node PD, and the other end of the pull-down capacitor C2 may be coupled to the pull-down power terminal VGL. The pull-down capacitor C2 may be configured to keep the potential of the pull-down node PD.

One end of the output capacitor C3 may be coupled to the pull-up node PU, and the other end of the output capacitor C3 may be coupled to the output terminal OUT. The output capacitor C3 may be configured to keep the potential of the pull-up node PU.

A gate of the output transistor M9 may be coupled to the pull-up node PU, a first electrode of the output transistor M9 may be coupled to the second clock signal terminal CKB, and a second electrode of the output transistor M9 may be coupled to the output terminal OUT.

Correspondingly, for the gate drive circuit 04 to which the shift register unit 041 shown in FIGS. 9 and 10 belongs, the drive signal lines coupled to the gate drive circuit 04 include the signal line coupled to the first control signal terminal CN, the signal line coupled to the second control signal terminal CNB, the signal line coupled to the reset signal terminal RST, the signal line coupled to the first clock signal terminal CK, the signal line coupled to the second clock signal terminal CKB, the signal line coupled to the pull-down power terminal VGL, and the signal line coupled to the initial signal terminal. In conjunction with the description of the embodiment of FIG. 9, the initial signal terminal is coupled to the first input terminal IN1 coupled to the first stage of shift register unit 041 and the second input terminal IN2 coupled to the last stage of shift register unit 041. As such, in the case that the two shift register units 041 are symmetrically arranged between two rows of target pixels P0, the two shift register units 041 may share one signal line coupled to the pull down power terminal VGL.

Figure 12:
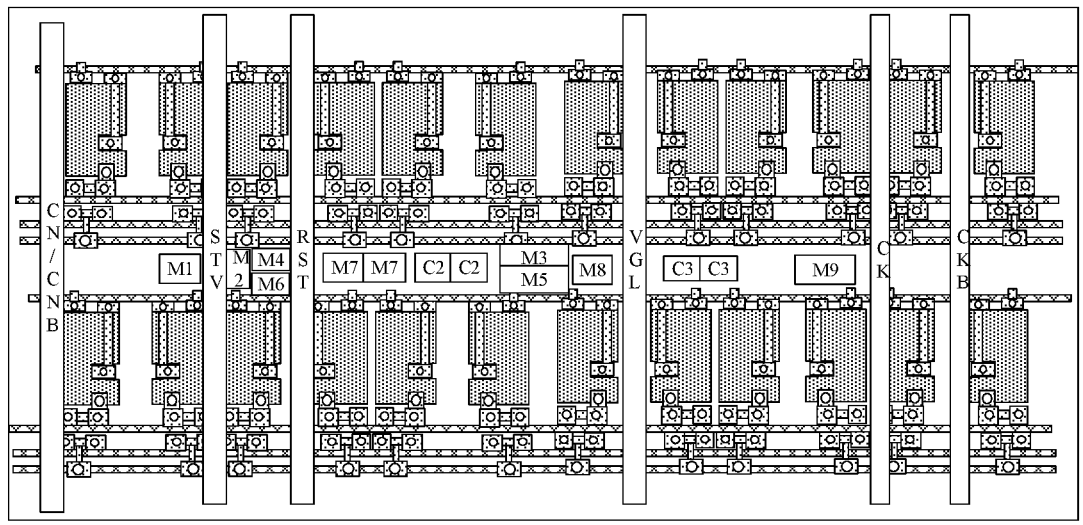
FIG. 12 is a schematic structural diagram of yet another display substrate according to an embodiment of the present disclosure.

Referring to FIG. 12, FIG. 12 shows a circuit structure of the shift register unit 041 disposed between two adjacent rows of pixels P0, and an optional position of the drive signal line (e.g., the signal line STV coupled to the initial signal terminal) according to the shift register unit 041 shown in FIG. 10. It can be seen in combination with FIG. 8 to FIG. 11 that, in the layout process, the relatively large-sized transistor in the shift register unit 041 may be disposed in region 1 and region 2 with a relatively big area, and the relatively small-sized transistor in the shift register unit 041 may be disposed in region 3 and region 4 with a relatively small area. Referring to FIG. 12, two transistors (e.g., two transistors M7 shown in FIG. 12) may further be connected in series to form one transistor, or two capacitors (e.g., two capacitors C2, or two capacitors C3 shown in FIG. 12) may be connected in series to form one capacitor, such that all transistors in the shift register unit 041 may be reliably disposed within a limited space of the base substrate 01.

In the case that the area of the base substrate P01 is determined, compared with the related art where the light emitting control circuit P01 is not shared, at least two pixels P0 share the same light emitting control circuit P01 in the embodiments of the present disclosure, such that the area of regions, other than the region in which the pixels P0 are disposed, on the base substrate 01 is larger. Thus, an efficient technical support is provided for disposing the gate drive circuit 04 on the base substrate 01. That is, a technical support is provided for the GIA display substrate with a high resolution (per pixel inch, PPI).

Figure 13:
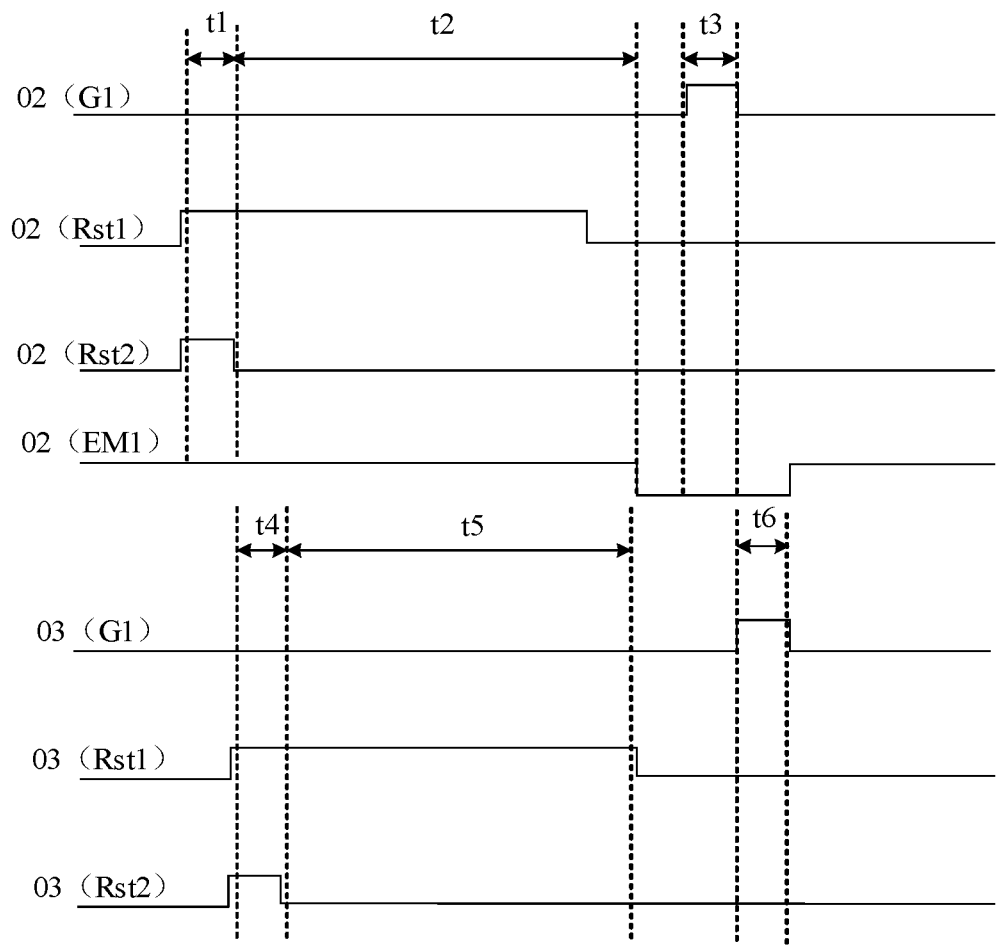
FIG. 13 is a timing diagram of an operation of a pixel according to an embodiment of the present disclosure.

Assuming that the transistors in the pixel P0 are N-type transistors, in combination with the two adjacent pixels P0 sharing the same light emitting control circuit P01 shown in FIG. 4 (i.e., the first pixel 02 in the $n^{th}$ row and the second pixel 03 in the $(n+1)^{th}$ row), the operation principle of the pixel provided by the embodiments of the present disclosure is described, and FIG. 13 is a timing diagram of an operation of a pixel according to an embodiment of the present disclosure.

Referring to FIG. 13, in t1 phase, in the first pixel 02 (the $n^{th}$ row of pixel P0), the second reset control line Rst2 coupled to the second reset transistor T2 provides the second reset control signal at the first potential, and the second reset transistor T2 is turned on. The first reset control line Rst1 coupled to the first reset transistor T1 also provides the first reset control signal at the first potential, and the first reset transistor T1 is turned on. Correspondingly, the first reset signal line Vin1 may output a first reset signal at the second potential to the gate of the drive transistor T0 by the first reset transistor T1, to reset the gate of the drive transistor T0. The second reset signal line Vin2 may output a second reset signal at the second potential to the first electrode of the light emitting element L1 by the second reset transistor T2, to reset the first electrode of the light emitting element L1. The first reset signal may act as compensation data Vref1 for driving the row of pixels. The t1 phase may also be referred to as a reset phase during driving of the $n^{th}$ row of pixel P0.

In t2 phase, in the first pixel 02 (the $n^{th}$ row of pixel P0), the first reset control line Rst1 coupled to the first reset transistor T1 continuously provides the first reset control signal at the first potential. The first reset transistor T1 keeps being turned on. The first reset signal line Vin1 may continue outputting the first reset signal to the gate of the drive transistor T0 by the first reset transistor T1. Under the coupling effect of the storage capacitor C1, the potential of the gate of the drive transistor T0 may change with the potential of the second electrode of the drive transistor T0, until to Vref1−Vth1, and Vth1 is a threshold voltage of the drive transistor T0. The t2 phase may be referred to as a compensation phase during driving of the $n^{th}$ row of pixel P0.

In t3 phase, in the first pixel 02 (the $n^{th}$ row of pixel P0), the gate line G1 coupled to the data write transistor T4 begins to provide the gate drive signal at the first potential, and the data write transistor T4 is turned on. The data line D1 outputs a data signal to the gate of the drive transistor T0 by the data write transistor T4. The t3 phase may be referred to as a data write phase during driving of the $n^{th}$ row of pixel P0.

In t4 phase, in the second pixel 03 (the $(n+1)^{th}$ row of pixel P0), the second reset control line Rst2 coupled to the second reset transistor T2 provides the second reset control signal at the first potential, and the second reset transistor T2 is turned on. The first reset control line Rst1 coupled to the first reset transistor T1 also provides the first reset control signal at the first potential, and the first reset transistor T1 is turned on. Correspondingly, the first reset signal line Vin1 may output the first reset signal at the second potential to the gate of the drive transistor T0 by the first reset transistor T1, thereby resetting the gate of the drive transistor T0. The second reset signal line Vin2 may output the second reset signal at the second potential to the first electrode of the light emitting element L1 by the second reset transistor T2, thereby resetting the first electrode of the light emitting element L1. The first reset signal may act as compensation data Vref2 during driving of this row of pixel. The t4 phase may be referred to as a reset phase during driving of the $(n+1)^{th}$ row of pixel P0.

In t5 phase, in the second pixel 03 (the $(n+1)^{th}$ row of pixel P0), the first reset control line Rst1 coupled to the first reset transistor T1 continuously provides the first reset control signal at the first potential. The first reset transistor T1 keeps being turned on. The first reset signal line Vin1 may continue outputting the second initial signal to the gate of the drive transistor T0 by the first reset transistor T1. Under the coupling effect of the storage capacitor C1, the potential of the gate of the drive transistor T0 may change with the potential of the second electrode of the drive transistor T0, until to Vref2−Vth2, and Vth2 is the threshold voltage of the drive transistor T0. The t5 phase may be referred to as a compensation phase during driving of the $(n+1)^{th}$ row of pixel P0.

In t6 phase, the second pixel 03 (the $(n+1)^{th}$ row of pixel P0), the gate line G1 coupled to the data write transistor T4 begins to provide the gate drive signal at the first potential, and the data write transistor T4 is turned on. The data line D1 may output a data signal to the gate of the drive transistor T0 by the data write transistor T4. The t6 phase may be referred to as a data write phase during driving of the $(n+1)^{th}$ row of pixel P0.

It should be noted that referring to FIG. 13, the light emitting control line EM1 coupled to the light emitting control transistor T3 shared by the first pixel 02 (the $n^{th}$ row of pixel P0) and the second pixel 03 (the $(n+1)^{th}$ row of pixel P0) continuously provides the light emitting control signal at the first potential in phase t1, phase t2, phase t4, and phase t5. The first power terminal VDD may output, by the light emitting control transistor T3, a first power signal to the first electrode of the drive transistor T0 in each of the first pixel 02 and the second pixel 03. After the t3 phase, in the $n^{th}$ row of pixel P0, the drive transistor T0 may output, based on the first power signal and the data signal, the light emitting drive signal to the coupled light emitting element L1 to drive the $n^{th}$ row of light emitting element L1 to emit light. After the t6 phase, in the $(n+1)^{th}$ row of pixel P0, the drive transistor T0 may output, based on the first power signal and the data signal, the drive signal to the coupled light emitting element L1 to drive the $(n+1)^{th}$ row of light emitting element L1 to emit light.

In summary, the embodiments of the present disclosure provide a display substrate. The display substrate includes two pixels arranged along a first direction and adjacent to each other on a base substrate, and the pixel circuit in each of the two pixels includes a drive transistor, a first reset transistor, and a second reset transistor. Because the first reset transistors are arranged symmetrically along a symmetry axis of the first portion of the coupled first reset signal line, and the first portion of the first reset signal line extends along the second direction intersected with the first direction. Therefore, layout and signal traces in the display substrate may be facilitated, and the plurality of signal lines coupled to the pixels may be centrally disposed to effectively optimize the pixel space.

Furthermore, because in the display substrate, at least two pixels disposed on the base substrate may share the same light emitting control circuit coupled to the light emitting control line, the number of light emitting control circuits required to be set in the display substrate may be reduced, or the number of light emitting control lines required to be set in the display substrate may be further reduced. That is, the area, occupied by each pixel, of the base substrate is smaller. Therefore, both the gate drive circuit that provides the signal for the signal line coupled to the pixels, and the drive signal line coupled to the gate drive circuit can be disposed on the base substrate. The display substrate provided in the embodiments of the present disclosure has a higher resolution.

Figure 14:
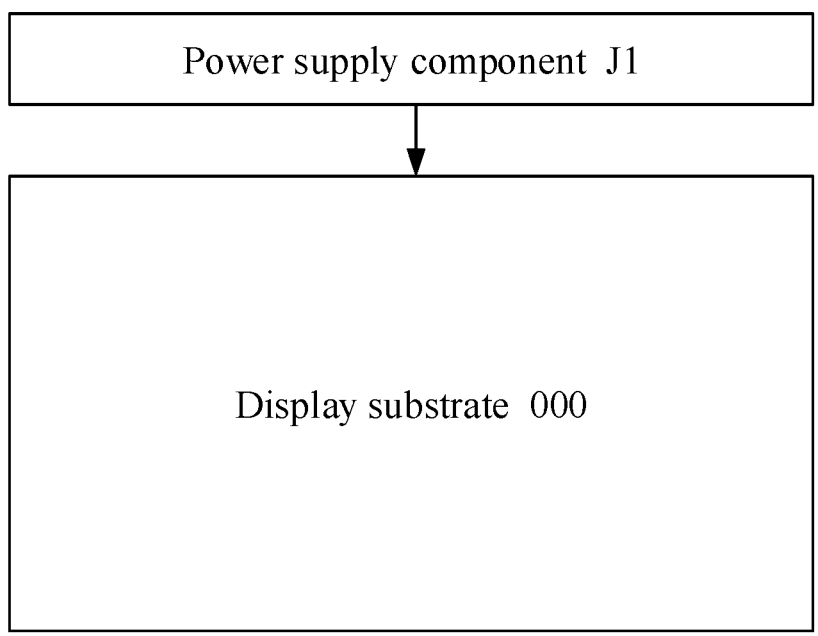
FIG. 14 is a schematic structural diagram of a display device according to an embodiment of the present disclosure.

FIG. 14 is a schematic structural diagram of a display device according to an embodiment of the present disclosure. As shown in FIG. 14, the display device may include a power supply component J1 and a display substrate 000 shown in any of FIGS. 5 to 9, and 12. The power supply component J1 is coupled to the display substrate 000, and is configured to supply power to the display substrate 000.

Figure 15:
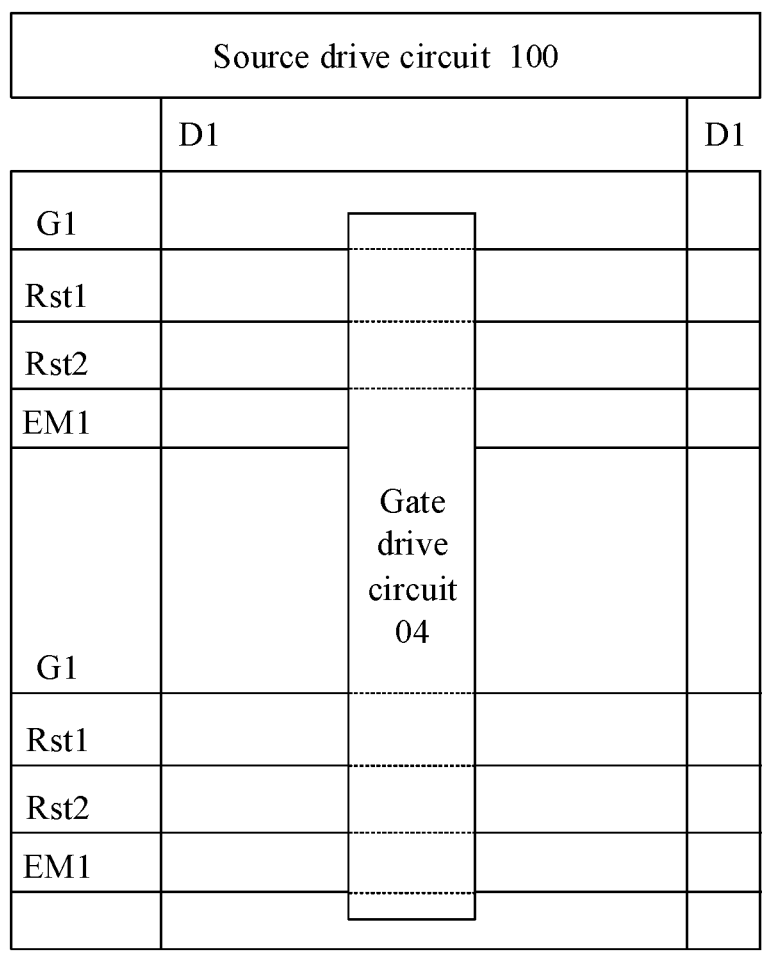
FIG. 15 is a schematic structural diagram of another display device according to an embodiment of the present disclosure.

FIG. 15 is a schematic diagram of a display device according to an embodiment of the present disclosure. As shown in FIG. 15, the display device may further include a source drive circuit 100.

The source drive circuit 100 may be coupled to a plurality of data lines D1 in the display substrate 000, and may be configured to provide a data signal to each of the data lines.

FIG. 15 further shows a gate drive circuit 04, a plurality of gate lines G1, a plurality of first reset control lines Rst1, a plurality of second reset control lines Rst2, and a plurality of light emitting control lines EM1 that are included in the display substrate 000. The gate drive circuit 04 may be coupled to the plurality of gate lines G1, the plurality of first reset control lines Rst1, the plurality of second reset control lines Rst2, and the plurality of light emitting control lines EM1. The gate drive circuit 04 may be configured to provide a gate drive signal for the plurality of gate lines G1, a first reset control signal for the plurality of first reset control lines Rst1, a second reset control signal for the plurality of second reset control lines Rst2, and a light emitting control drive signal for the plurality of light emitting control lines EM1.

Optionally, in the embodiment of the present disclosure, to reliably provide the drive signal to the plurality of gate lines G1, the plurality of first reset control lines Rst1, the plurality of second reset control lines Rst2, and the plurality of light emitting control lines EM1, the gate drive circuit 04 may include four gate drive circuits, i.e., a gate drive circuit for providing the gate drive signal to the gate lines, a gate drive circuit for providing the first reset control signal to the first reset control lines Rst1, a gate drive circuit for providing the second reset control signal to the second reset control lines Rst2, and a gate drive circuit for supplying the light emitting control drive signal to the light emitting control lines EM1. In combination with FIG. 7, each gate drive circuit may be composed of at least two cascaded shift register units 041, and each shift register unit 041 may be coupled to one corresponding signal line (e.g., the gate line).

Optionally, the display device may be an OLED display device, an electronic paper, a mobile phone, a tablet computer, a television, a display, a laptop computer, a digital photo frame, or any product or component having a display function.

It should be understood that the term "a plurality of" referred herein means two or more. The above description is merely optional embodiments of the present disclosure, and is not intended to limit the present disclosure. Any modifications, equivalent substitutes, improvements made within the spirit and scope of the present disclosure should fall within the scope of protection of the present disclosure.

What is claimed is:

1. A display substrate, comprising:
    a base substrate;
    a first pixel and a second pixel disposed on the base substrate, wherein the first pixel and the second pixel are arranged along a first direction and are adjacent, and both the first pixel and the second pixel comprise a pixel circuit and a light emitting element, the pixel circuit comprising a drive transistor, a first reset transistor, and a second reset transistor; wherein
    the first reset transistor is coupled to a first reset control line, a first reset signal line, and a gate of the drive transistor, and the first reset transistor is configured to, in response to a first reset control signal provided by the first reset control line, transmit a first reset signal provided by the first reset signal line to the gate of the drive transistor to reset the gate of the drive transistor; and
    the second reset transistor is coupled to a second reset control line, a second reset signal line, and a first electrode of the light emitting element, and the second reset transistor is configured to, in response to a second reset control signal provided by the second reset control line, transmit a second reset signal provided by the second reset signal line to the first electrode of the light emitting element to reset the first electrode of the light emitting element;
    wherein the first reset signal line comprises a first portion extending along a second direction, and the first reset transistors, the second reset transistors, and the drive transistors in the first pixel and in the second pixel are arranged symmetrically along a symmetry axis of the first portion respectively, the second direction being a row direction, and the second direction being intersected with the first direction;
    the second reset signal line comprises a second portion extending along the second direction; the first reset transistors, the second reset transistors, and the drive transistors in the first pixel and in the second pixel are arranged symmetrically along a symmetry axis of the second portion respectively;
    the first reset control line extends along the second direction, and the first reset control line coupled to the pixel circuit in the first pixel and the first reset control line coupled to the pixel circuit in the second pixel are arranged symmetrically along the symmetry axis of the first portion;
    the second reset control line extends along the second direction, and the second reset control line coupled to the pixel circuit in the first pixel and the second reset control line coupled to the pixel circuit in the second pixel are arranged symmetrically along the symmetry axis of the second portion; and
    the symmetry axis of the first portion is overlapped with the symmetry axis the second portion.

2. The display substrate according to claim 1, wherein the pixel circuit further comprises: a light emitting control transistor;
    wherein the light emitting control transistor is coupled to a light emitting control line, a first power terminal, and a first electrode of the drive transistor, and the light emitting control transistor is configured to, in response to a light emitting control signal provided by the light emitting control line, transmit a first power signal provided by the first power terminal to the first electrode of the drive transistor; and
    a second electrode of the drive transistor is coupled to the first electrode of the light emitting element, a second electrode of the light emitting element is coupled to a second power terminal, the drive transistor is configured to transmit a light emitting drive signal to the first electrode of the light emitting element based on a potential of the gate of the drive transistor and a potential of the first electrode of the drive transistor, and the light emitting element is configured to emit light based on the light emitting drive signal and a second power signal provided by the second power terminal.

3. The display substrate according to claim 2, wherein the light emitting control transistor in the pixel circuit in the first pixel and the light emitting control transistor in the pixel circuit in the second pixel are the same transistor; and
    the light emitting control transistor is disposed between the second reset signal line coupled to the pixel circuit in the first pixel and the second reset signal line coupled to the pixel circuit in the second pixel.

4. The display substrate according to claim 3, wherein the light emitting control line extends along the second direction, and both the symmetry axis of the first portion and the symmetry axis of the second portion are overlapped with the light emitting control line.

5. The display substrate according to claim 2, wherein the pixel circuit further comprises: a data write transistor,
    wherein the data write transistor is coupled to a gate line, a data line, and the drive transistor, and the data write transistor is configured to transmit a data signal provided by the data line to the drive transistor in response to a gate drive signal provided by the gate line.

6. The display substrate according to claim 5, wherein the data write transistor in the first pixel and the data write transistor in the second pixel are arranged symmetrically along the symmetry axis of the first portion.

7. The display substrate according to claim 5, wherein the gate line extends along the second direction; and the gate line coupled to the pixel circuit in the first pixel and the gate line coupled to the pixel circuit in the second pixel are arranged symmetrically along the symmetry axis of the first portion.

8. The display substrate according to claim 5, wherein the data line extends along the first direction.

9. The display substrate according to claim 5, wherein the first reset signal line, the first reset control line, the gate line, the second reset control line, the second reset signal line, and the light emitting control line coupled to the pixel circuit in one of the first pixel and the second pixel are arranged sequentially along a direction going close to the other one of the first pixel and the second pixel.

10. The display substrate according to claim 9, wherein in the pixel circuit in one of the first pixel and the second pixel, the first reset transistor, the data write transistor, the drive transistor, the second reset transistor, and the light emitting control transistor are sequentially arranged along the direction going close to the other one of the first pixel and the second pixel; and the first reset transistor, the data write transistor, the drive transistor, and the second reset transistor are disposed between the first reset signal line and the second reset signal line.

11. A display device comprising: a power supply component, and a display substrate, wherein the power supply component is coupled to the display substrate, and is configured to supply power to the display substrate; and the display substrate comprises:

a base substrate;

a first pixel and a second pixel disposed on the base substrate, wherein the first pixel and the second pixel are arranged along a first direction and are adjacent, and both the first pixel and the second pixel comprise a pixel circuit and a light emitting element, the pixel circuit comprising a drive transistor, a first reset transistor, and a second reset transistor; wherein the first reset transistor is coupled to a first reset control line, a first reset signal line, and a gate of the drive transistor, and the first reset transistor is configured to, in response to a first reset control signal provided by the first reset control line, transmit a first reset signal provided by the first reset signal line to the gate of the drive transistor to reset the gate of the drive transistor; and the second reset transistor is coupled to a second reset control line, a second reset signal line, and a first electrode of the light emitting element, and the second reset transistor is configured to, in response to a second reset control signal provided by the second reset control line, transmit a second reset signal provided by the second reset signal line to the first electrode of the light emitting element to reset the first electrode of the light emitting element;

wherein the first reset signal line comprises a first portion extending along a second direction, and the first reset transistors, the second reset transistors, and the drive transistors in the first pixel and in the second pixel are arranged symmetrically along a symmetry axis of the first portion respectively, the second direction being a row direction, and the second direction being intersected with the first direction;

the second reset signal line comprises a second portion extending along the second direction; the first reset transistors, the second reset transistors, and the drive transistors in the first pixel and in the second pixel are arranged symmetrically along a symmetry axis of the second portion respectively;

the first reset control line extends along the second direction, and the first reset control line coupled to the pixel circuit in the first pixel and the first reset control line coupled to the pixel circuit in the second pixel are arranged symmetrically along the symmetry axis of the first portion;

the second reset control line extends along the second direction, and the second reset control line coupled to the pixel circuit in the first pixel and the second reset control line coupled to the pixel circuit in the second pixel are arranged symmetrically along the symmetry axis of the second portion; and the symmetry axis of the first portion is overlapped with the symmetry axis the second portion.

* * * * *